(12) United States Patent
Son et al.

(10) Patent No.: US 12,471,430 B2
(45) Date of Patent: Nov. 11, 2025

(54) DISPLAY DEVICE

(71) Applicant: Samsung Display Co., Ltd., Yongin-si (KR)

(72) Inventors: Sun Kwun Son, Yongin-si (KR); Na Hyeon Cha, Yongin-si (KR); Chong Chul Chai, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 511 days.

(21) Appl. No.: 17/452,756

(22) Filed: Oct. 28, 2021

(65) Prior Publication Data
US 2022/0285427 A1 Sep. 8, 2022

(30) Foreign Application Priority Data

Mar. 8, 2021 (KR) .................. 10-2021-0030413

(51) Int. Cl.
*H10H 29/14* (2025.01)

(52) U.S. Cl.
CPC ................ *H10H 29/142* (2025.01)

(58) Field of Classification Search
CPC .......... H01L 27/156; G09G 2310/0281; G09G 2300/0426; G09G 3/3266; G09G 3/32; H10H 29/142; H10H 20/818; H10D 86/441

See application file for complete search history.

(56) References Cited

U.S. PATENT DOCUMENTS

| | | | |
|---|---|---|---|
| 9,679,520 B2 | 6/2017 | Gai et al. | |
| 10,049,635 B2 | 8/2018 | Kawamura et al. | |
| 2016/0019856 A1 | 1/2016 | Tanaka et al. | |
| 2016/0253967 A1 | 9/2016 | Gai et al. | |
| 2018/0039146 A1 | 2/2018 | Tanaka et al. | |
| 2018/0322837 A1 | 11/2018 | Sakurai et al. | |
| 2018/0331124 A1* | 11/2018 | Cho | H10D 86/441 |
| 2019/0206976 A1 | 7/2019 | Jeong et al. | |
| 2019/0278145 A1* | 9/2019 | Tanaka | G02F 1/136286 |

(Continued)

FOREIGN PATENT DOCUMENTS

| | | |
|---|---|---|
| CN | 111812898 A | 10/2020 |
| EP | 3 813 137 A1 | 4/2021 |

(Continued)

*Primary Examiner* — Britt D Hanley
*Assistant Examiner* — Casey Paul Boatman
(74) *Attorney, Agent, or Firm* — Womble Bond Dickinson (US) LLP

(57) ABSTRACT

A display device may include first signal lines arranged in a display area, and extending in a first direction, pixels arranged in the display area, and respectively connected to the first signal lines, first pads located in a first pad area at a side of the display area in the first direction, and arranged along a second direction, first lines extending along the first direction to the display area from the first pad area, and respectively connected to the first pads, and second lines arranged in the display area, and respectively connecting the first lines to the first signal lines, wherein the display area includes a first sub-display area corresponding to the first pad area, and a second sub-display area adjacent the first sub-display area, and wherein the first lines are arranged only in the first sub-display area among the first and second sub-display areas.

20 Claims, 12 Drawing Sheets

(56) References Cited

U.S. PATENT DOCUMENTS

| | | | |
|---|---|---|---|
| 2020/0312882 A1 | 10/2020 | Son | |
| 2020/0395429 A1 | 12/2020 | Cho et al. | |
| 2021/0012708 A1* | 1/2021 | Yang | G09G 3/3225 |
| 2021/0104593 A1 | 4/2021 | Kang et al. | |
| 2021/0264849 A1* | 8/2021 | Suzuki | G09G 3/32 |

FOREIGN PATENT DOCUMENTS

| | | |
|---|---|---|
| KR | 10-2020-0010697 A | 1/2020 |
| KR | 10-2021-0041163 A | 4/2021 |

* cited by examiner

CL1: CL1[1]~CL1[N]
DL(SLI2): DL[1]~DL[M]
SL(SLI1): SL[1]~SL[N]

DISPLAY DEVICE

CROSS-REFERENCE TO RELATED APPLICATION

This application claims priority to, and the benefit of, Korean patent application No. 10-2021-0030413 filed on Mar. 8, 2021 in the Korean Intellectual Property Office, the entire disclosure of which is incorporated herein by reference.

BACKGROUND

1. Field

The present disclosure generally relates to a display device.

2. Description of Related Art

Recently, interest in information displays and display technology has been increased. Accordingly, research and development of display devices have been continuously conducted.

SUMMARY

Embodiments provide a display device capable of reducing a non-display area.

In accordance with an aspect of the present disclosure, there is provided a display device including first signal lines arranged in a display area, and extending in a first direction, pixels arranged in the display area, and respectively connected to the first signal lines, first pads located in a first pad area at a side of the display area in the first direction, and arranged along a second direction, first lines extending along the first direction to the display area from the first pad area, and respectively connected to the first pads, and second lines arranged in the display area, and respectively connecting the first lines to the first signal lines, wherein the display area includes a first sub-display area corresponding to the first pad area, and a second sub-display area adjacent the first sub-display area, and wherein the first lines are arranged only in the first sub-display area among the first and second sub-display areas.

The first lines may be arranged along the second direction at a same pitch as the first pads at a boundary of the display area and the first pad area.

The display area may include first line areas respectively between adjacent pixel rows, and extending in the first direction.

The first lines may be in the first line areas, and extend along the first direction.

The display area may include second line areas respectively between adjacent pixel columns, and extending in the second direction, wherein the second lines are in the second line areas.

The first lines may be respectively connected to the second lines through respective first contact parts in areas in which the first line areas and the second line areas cross each other.

The first line areas may be respectively between pixel circuit areas of the adjacent pixel rows, wherein the second line areas are respectively between pixel circuit areas of the adjacent pixel columns.

The second lines may extend along the second direction, and are arranged in the first sub-display area and the second sub-display area.

The pixels may include sub-pixels, which include pixel circuits in respective pixel areas, and respectively connected to the first signal lines, and light emitting units respectively in the pixel areas to respectively overlap the pixel circuits, and including at least one light emitting element connected to a respective one of the pixel circuits.

The pixel circuits of the sub-pixels may be arranged along the second direction in the pixel areas, wherein the light emitting units of the sub-pixels are arranged along the first direction in the pixel areas.

The first lines and the second lines may be in different layers of a pixel circuit layer in which the pixel circuits of the sub-pixels are formed, wherein the first signal lines are in a same layer as the first lines.

The display device may further include second signal lines arranged in the display area to cross the first signal lines, and respectively connected to the pixels.

The first lines may be spaced apart from, and in a same layer as, the first signal lines, wherein the second lines are spaced apart from, and in a same layer as, the second signal lines.

The first signal lines may include scan lines for receiving scan signals, wherein the second signal lines include data lines for receiving data signals.

The first direction may be a horizontal direction of the display area, wherein the second direction is a vertical direction of the display area.

The first signal lines may include data lines for receiving data signals, wherein the second signal lines include scan lines for receiving scan signals.

The first direction may be a vertical direction of the display area, wherein the second direction is a horizontal direction of the display area.

The display device may further include second pads in a second pad area at a side of the display area in the second direction, third lines extending along the second direction to the display area from the second pad area, and respectively connected to the second pads, and fourth lines crossing the third lines and the second signal lines, and respectively connecting the third lines to the second signal lines.

The display area may include a third sub-display area corresponding to the second pad area, and a fourth sub-display area adjacent the third sub-display area in the first direction, wherein the third lines are arranged only in the third sub-display area among the third and fourth sub-display areas.

The third lines may be arranged along the first direction at a same pitch as the second pads at a boundary between the display area and the second pad area.

BRIEF DESCRIPTION OF THE DRAWINGS

Embodiments will now be described more fully hereinafter with reference to the accompanying drawings. However, the embodiments may be embodied in different forms and should not be construed as limited to the embodiments set forth herein. Rather, these embodiments are provided so that this disclosure will be thorough and complete, and will fully convey the scope of the embodiments to those skilled in the art.

DETAILED DESCRIPTION

Figure 1:
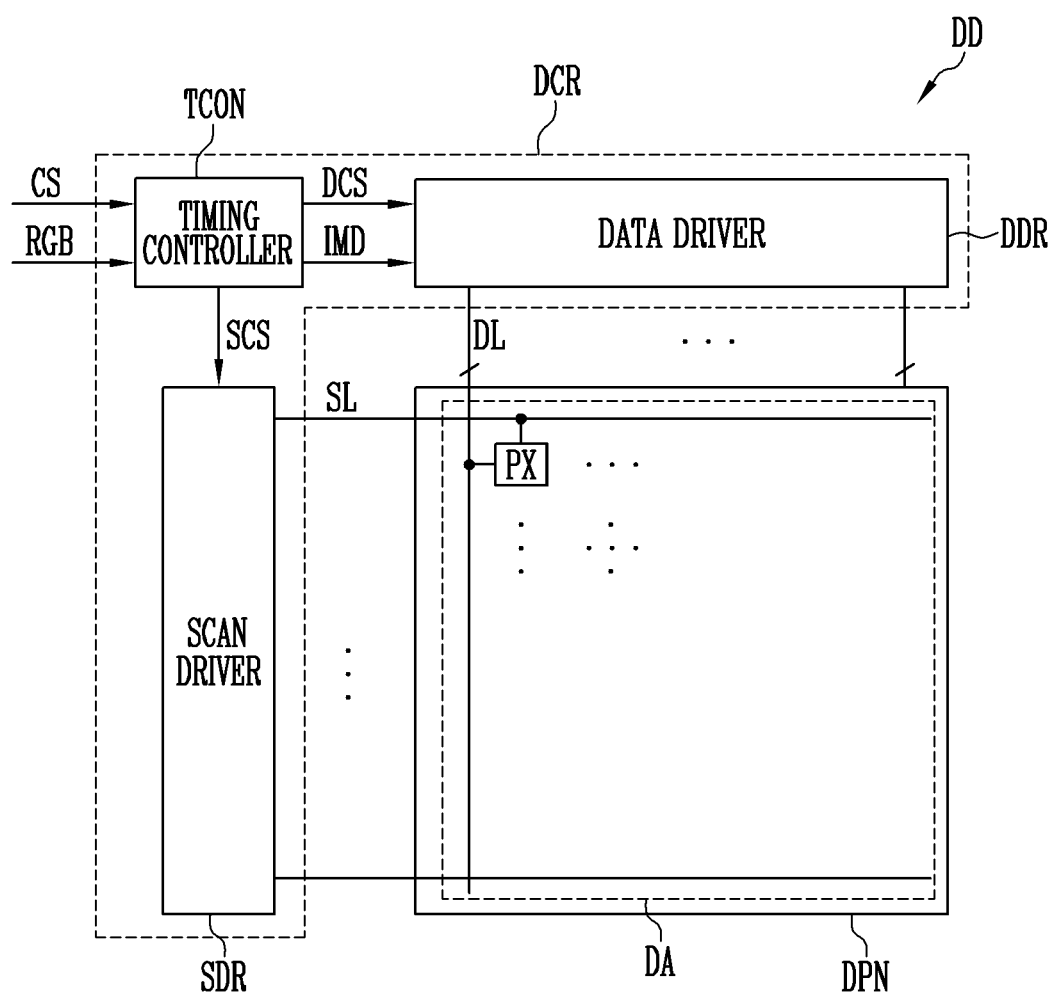
FIG. 1 is a block diagram illustrating a display device in accordance with some embodiments of the present disclosure.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place.

Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, the term "and/or" includes any and all combinations of one or more of the associated listed items. For example, the expression such as "A and/or B" may include A, B, or A and B.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section.

Thus, a first element, component, region, layer or section described below could be termed a second element, component, region, layer or section, without departing from the spirit and scope of the present disclosure. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a block diagram illustrating a display device in accordance with some embodiments of the present disclosure.

Referring to FIG. 1, the display device DD in accordance with some embodiments of the present disclosure may include a display panel DPN including pixels PX, and a driving circuit DCR for driving the pixels PX. The driving circuit DCR may include a scan driver SDR, a data driver DDR, and a timing controller TCON. Although a case where the display panel DPN, the scan driver SDR, the data driver DDR, and the timing controller TCON are shown as separate components in FIG. 1, the present disclosure is not limited thereto. For example, the display panel DPN, the scan driver SDR, the data driver DDR, and/or the timing controller TCON may be integrally manufactured as one panel and/or one driving IC.

The display panel DPN may include a display area DA. The display area DA may include scan lines SL, data lines DL, and the pixels PX connected to the scan lines SL and the data lines DL. In some embodiments of the present disclosure, the term "connection" may inclusively mean a physical connection and an electrical connection.

The scan lines SL may connect the scan driver SDR and the pixels PX to each other. Accordingly, scan signals output from the scan driver SDR may be transferred to the pixels PX through the scan lines SL. A driving timing of the pixels PX (e.g., a data programming period in which data signals are respectively input to the pixels PX) may be controlled by the scan signals.

The data lines DL may connect the data driver DDR and the pixels PX to each other. Accordingly, data signals output from the data driver DDR may be transferred to the pixels PX through the data lines DL. Light emission luminance of the pixels PX may be controlled by using the data signals.

In some embodiments, each pixel PX may include a plurality of sub-pixels. The data line DL of each pixel column may include a plurality of sub-data lines, and the sub-data lines may be connected to different sub-pixels of the corresponding pixel column. Accordingly, data signals may be individually transferred respectively to the sub-pixels.

The pixels PX may be arranged in the display area DA. In some embodiments, the pixels PX may be arranged in the display area DA in a matrix form, and the display area DA may include a plurality of pixel rows and a plurality of pixel columns. Each of the pixel rows may include a plurality of pixels PX arranged in a horizontal direction (e.g., a row direction), and each of the pixel columns may include a plurality of pixels PX arranged in a vertical direction (e.g., a column direction). The arrangement of the pixels PX may be variously changed or modified according to various embodiments.

The pixels PX may be connected to signal lines to receive control signals supplied from the signal lines. For example, each pixel PX may be connected to a scan line SL of a corresponding pixel row and to a data line DL of a corresponding pixel column. The pixels PX may be supplied with data signals from the respective data lines DL when scan signals are supplied from the respective scan lines SL. Also, the pixels PX may be selectively further connected to another type of signal line (e.g., to sensing lines). The pixels PX may emit light with luminances corresponding to the data signals for every emission period of each frame.

Additionally, the pixels PX may be further connected to power lines. For example, the pixels PX may be connected to a first power line and to a second power line to be supplied with a first power source and with a second power source.

In some embodiments, the pixels PX may be self-luminous pixels each including at least one light emitting element. However, the present disclosure is not limited thereto, and the kind, structure, and/or driving method of the pixels PX may be changed in some embodiments.

The scan driver SDR may be supplied with a first control signal SCS from the timing controller TCON, and may supply scan signals to the scan lines SL corresponding to the first control signal SCS. The first control signal SCS may be a scan control signal. For example, the first control signal SCS may include a scan start signal (e.g., a sampling pulse input to a first stage of the scan driver SDR) and at least one scan clock signal.

The scan driver SDR may sequentially output the scan signals to the scan lines SL corresponding to the first control signal SCS. The pixels PX selected by the scan signals may be supplied with data signals of a corresponding frame from the data lines DL.

The data driver DDR may be supplied from a second control signal DCS and image data IMD, and may generate data signals corresponding to the second control signal DCS and the image data IMD. The second control signal DCS may be a data control signal. For example, the second control signal DCS may include a source sampling pulse, a source sampling clock, a source output enable signal, and the like. The data signals may be voltage or current signals corresponding to luminances to be displayed in the respective pixels PX. In an example, the data signals may be generated in the form of data voltages.

The data driver DDR may output the data signals to the data lines DL corresponding to the second control signal DCS and the image data IMD. For example, for each horizontal period, the data driver DDR may output, to the data lines DL, data signals corresponding to pixels PX selected in the corresponding horizontal period. The data signals output to the data lines DL may be supplied to pixels PX selected by a scan signal of the corresponding horizontal period.

The timing controller TCON may be supplied with a control signal CS and an input image signal RGB from the outside (e.g., a host processor), and may control operations of the scan driver SDR and the data driver DDR corresponding to the control signal CS and the input image signal RGB.

For example, the timing controller TCON may generate the first and second control signals SCS and DCS corresponding to the control signals CS. The control signals CS may include timing signals such as a vertical synchronization signal, a horizontal synchronization signal, and a main clock signal. The first control signal SCS generated by the timing controller TCON may be supplied to the scan driver SDR, and the second control signal DCS generated by the timing controller TCON may be supplied to the data driver DDR.

Also, the timing controller TCON may generate image data IMD of each frame by using an input image signal corresponding to an image to be displayed in the corresponding frame, and may supply the image data IMD to the data driver DDR. For example, the timing controller TCON may generate image data IMD by converting the data format of an input image signal RGB to be suitable for interface specifications with the data driver DDR.

Figure 2:
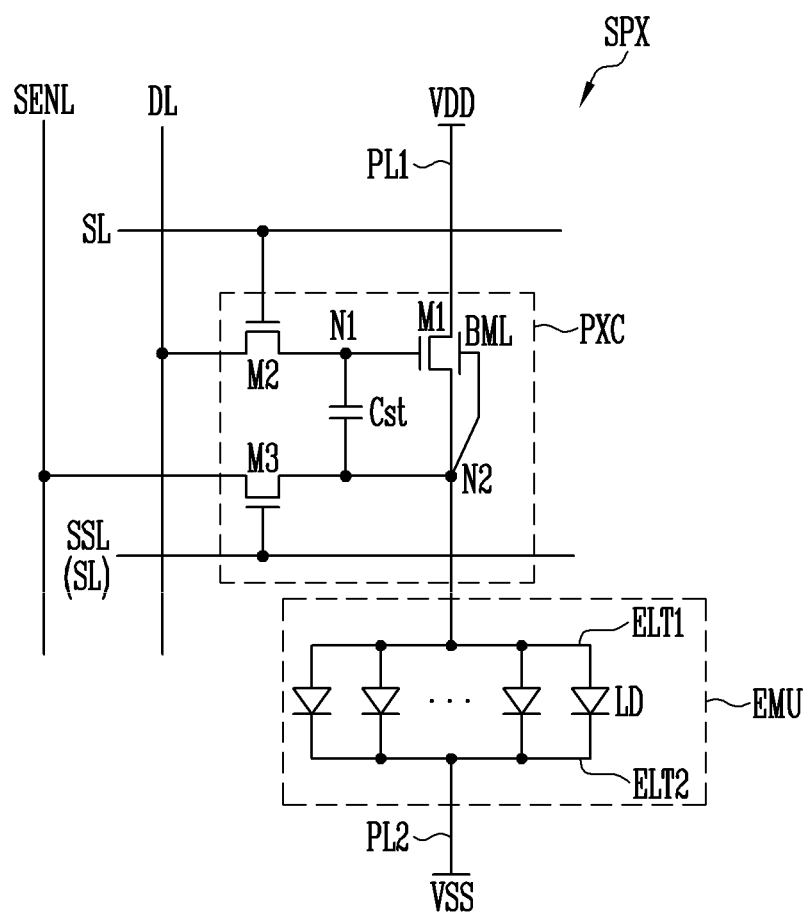
FIG. 2 is a circuit diagram illustrating a sub-pixel in accordance with some embodiments of the present disclosure.

FIG. 2 is a circuit diagram illustrating a sub-pixel in accordance with some embodiments of the present disclosure. FIG. 2 illustrates any one sub-pixel SPX that may be included in each pixel PX shown in FIG. 1. In some embodiments, sub-pixels SPX (or pixels PX) arranged in the display area DA may be configured substantially identical or similar to each other.

Referring to FIGS. 1 and 2, the sub-pixel SPX may be connected to at least one scan line SL, a data line DL (or sub-data line), a first power line PL1, and a second power line PL2. Also, the sub-pixel SPX may be selectively further connected to at least another power line and/or to at least another signal line.

The sub-pixel SPX may include a light emitting unit EMU for generating light with a luminance corresponding to each data signal. Also, the sub-pixel SPX may further include a pixel circuit PXC for driving the light emitting unit EMU.

The pixel circuit PXC may be connected to each scan line SL and the data line DL, and may be connected between the first power line PL1 and the light emitting unit EMU. For example, the pixel circuit PXC may be connected to the scan line SL to which a first scan signal is supplied, the data line DL to which a data signal is supplied, the first power line PL1 to which a first power source VDD is supplied, and a first electrode ELT1 of the light emitting unit EMU.

Also, the pixel circuit PXC may be selectively further connected to a control line SSL to which a second scan signal is supplied, and to a sensing line SENL connected to a reference power source (or initialization power source) or a sensing circuit, according to a display period or a sensing period. In some embodiments, the second scan signal may be a signal equal to, or different from, the first scan signal. When the second scan signal is a signal equal to the first scan signal, the control line SSL may be integrated with the scan line SL.

The pixel circuit PXC may include at least one transistor and a capacitor. For example, the pixel circuit PXC may include a first transistor M1, a second transistor M2, a third transistor M3, and a capacitor Cst.

The first transistor M1 may be connected between the first power line PL1 and a second node N2. The second node N2 may be a node at which the circuit pixel PXC and the light emitting unit EMU are connected to each other. For example, the second node N2 may be a node at which a first electrode (e.g., a source electrode) of the first transistor M1 and the first electrode ELT1 (e.g., an anode electrode) of the light emitting unit EMU are connected to each other. A gate electrode of the first transistor M1 may be connected to a first node N1. The first transistor M1 may control a driving current supplied to the light emitting unit EMU corresponding to a voltage of the first node N1.

In some embodiments, the first transistor M1 may further include a bottom metal layer BML (or back gate electrode). The gate electrode and the bottom metal layer BML of the first transistor M1 may overlap with each other with an insulating layer interposed therebetween. In some embodiments, the bottom metal layer BML may be connected to one electrode (e.g., the source electrode of the first transistor M1).

In some embodiments in which the first transistor M1 includes the bottom metal layer BML, there may be applied a back-biasing technique (or sync technique) for moving a threshold voltage of the first transistor M1 in a negative direction or positive direction by applying a back-biasing voltage to the bottom metal layer BML of the first transistor M1. In addition, when the bottom metal layer BML is located on the bottom of a semiconductor pattern constituting a channel of the first transistor M1, the bottom metal layer BML may block light incident into the semiconductor pattern, thereby stabilizing operational characteristics of the first transistor M1.

The second transistor M2 may be connected between the data line DL and the first node N1. In addition, a gate electrode of the second transistor M2 is connected to the scan line SL. The second transistor M2 may be turned on when the first scan signal having a gate-on voltage (e.g., a high level voltage) is supplied from the scan line SL to thereby connect the data line DL and the first node N1 to each other.

A data signal of a corresponding frame may be supplied to the data line DL for each frame period. The data signal may be transferred to the first node N1 through the second transistor M2 during a period in which the first scan signal having the gate-on voltage is supplied. That is, the second transistor M2 may be a switching transistor for transferring each data signal to the inside of the sub-pixel SPX.

One electrode of the capacitor Cst may be connected to the first node N1, and the other electrode of the capacitor Cst may be connected to the second node N2. The capacitor Cst charges a voltage corresponding to the data signal supplied to the first node N1 during each frame period.

The third transistor M3 may be connected between the second node N2 and the sensing line SENL. In addition, a gate electrode of the third transistor M3 may be connected to the control line SSL (or to the scan line SL). The third transistor M3 may be turned on when the second scan signal (or first scan signal) having the gate-on voltage (e.g., the high level voltage) is supplied, to thereby transfer to the second node N2 a reference voltage (or initialization voltage) that is supplied to the sensing line SENL, or to transfer a voltage of the second node N2 to the sensing line SENL. The voltage of the second node N2, which is transferred to the sensing circuit through the sensing line SENL, may be provided to an external circuit (e.g., the timing controller TCON), to be used in compensating for a characteristic deviation of the pixels PX (or sub-pixels SPX), etc.

Meanwhile, although a case where the transistors included in the pixel circuit PXC are all implemented with an N-type transistor has been illustrated in FIG. 2, the present disclosure is not limited thereto. For example, at least one of the first, second, and third transistors M1, M2, and M3 may be changed to a P-type transistor. In addition, the structure and driving method of the sub-pixel SPX may be variously changed in some embodiments.

The light emitting unit EMU may include the first electrode ELT1, a second electrode ELT2, and at least one light emitting element LD, which are connected between the first power line PL1 and the second power line PL2. For example, the light emitting unit EMU may include the first electrode ELT1 connected to the first power line PL1 through the first transistor M1, the second electrode ELT2 connected to the second power line PL2, and the at least one light emitting element LD connected between the first electrode ELT1 and the second electrode ELT2. In some embodiments, the light emitting unit EMU may include a plurality of light emitting elements LD connected in parallel between the first electrode ELT1 and the second electrode ELT2.

The first power source VDD supplied to the first power line PL1, and a second power source VSS supplied to the second power line PL2, may have different potentials. In an example, the first power source VDD may be a high-potential pixel power source, and the second power source VSS may be a low-potential pixel power source. A potential difference between the first power source VDD and the second power source VSS may be set to be higher than a threshold voltage of the light emitting elements LD.

The light emitting elements LD may be connected in a forward direction between the first electrode ELT1 and the second electrode ELT2 to constitute respective effective light sources. These effective light sources may constitute the light emitting unit EMU of the sub-pixel SPX.

The light emitting elements LD may emit light with a luminance corresponding to the driving current supplied through the pixel circuit PXC. The pixel circuit PXC may supply a driving current corresponding to the data signal to the light emitting unit EMU during each frame period. The driving current supplied to the light emitting unit EMU may be divided to flow through the light emitting elements LD. Accordingly, the light emitting unit EMU can emit light with a luminance corresponding to the driving current while each light emitting element LD is emitting light with a luminance corresponding to a current flowing therethrough.

Meanwhile, although some embodiments in which the sub-pixel SPX includes the light emitting unit EMU having a parallel structure has been disclosed in FIG. 2, the present disclosure is not limited thereto. For example, the sub-pixel SPX may include the light emitting unit EMU having a serial structure or a serial/parallel structure. The light emitting unit EMU may include a plurality of light emitting elements LD connected in series and/or series/parallel between the first electrode ELT1 and the second electrode ELT2. Alternatively, the sub-pixel SPX may include a single light emitting element LD connected between the first electrode ELT1 and the second electrode ELT2.

Figure 3:
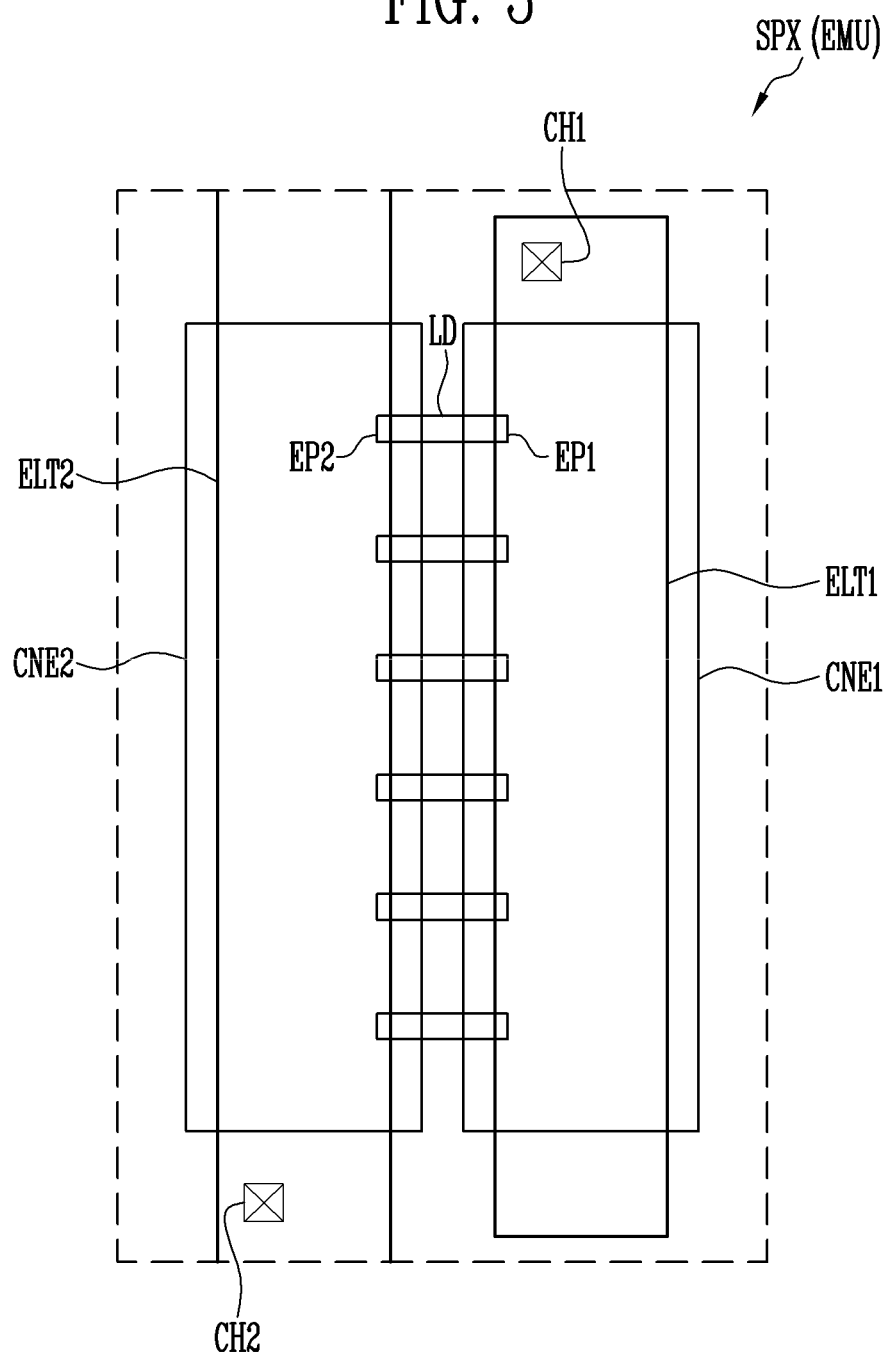
FIG. 3 is a plan view illustrating a light emitting unit of a sub-pixel in accordance with some embodiments of the present disclosure.

FIG. 3 is a plan view illustrating a light emitting unit EMU of a sub-pixel SPX in accordance with some embodiments of the present disclosure. For example, like FIG. 2, FIG. 3 illustrates a light emitting unit EMU including a first electrode ELT1, a second electrode ELT2, and a plurality of light emitting elements LD connected in parallel between the first and second electrodes ELT1 and ELT2.

In FIG. 3, some embodiments will be illustrated in which the light emitting unit EMU is connected, through first and second contact holes CH1 and CH2, to a power line/predetermined power line (e.g., a first power line PL1 and/or a second power line PL2), to a circuit element (e.g., at least one circuit element constituting a pixel circuit PXC of a corresponding sub-pixel SPX), and/or to a signal line (e.g., a scan line SL and/or a data line DL). However, in other embodiments, at least one of first and second electrodes ELT1 and ELT2 of each sub-pixel SPX may be connected directly to a power line (e.g., a predetermined power line) and/or a signal line (e.g., a predetermined signal line) without passing through a contact hole and/or an intermediate line.

Referring to FIGS. 2 and 3, the light emitting unit EMU may include a first electrode ELT1, a second electrode ELT2, and a plurality of light emitting elements LD located and/or aligned between the first and second electrodes ELT1 and ELT2. That the light emitting elements LD are located and/or aligned between the first and second electrodes ELT1 and ELT2 may mean that, when viewed on a plane, at least one area of each of the light emitting elements LD is located in an area that is between the first and second electrodes ELT1 and ELT2.

The light emitting unit EMU may further include a first contact electrode CNE1 and a second contact electrode CNE2, which are connected to the light emitting elements LD. Besides, the sub-pixel SPX may further include at least another electrode, a conductive pattern and/or an insulating pattern.

The first electrode ELT1 and the second electrode ELT2 may be spaced apart from each other. For example, the first electrode ELT1 and the second electrode ELT2 may be spaced apart from each other along a lateral direction (e.g., a horizontal direction) in each emission area (e.g., an emission area of each sub-pixel SPX), and each of the first electrode ELT1 and the second electrode ELT2 may extend along a longitudinal direction (e.g., a vertical direction). However, the shapes, sizes, positions, and/or relative arrangement structure of the first electrode ELT1 and the second electrode ELT2 may be variously changed in some embodiments.

Although some embodiments in which each light emitting unit EMU includes one first electrode ELT1 and one second electrode ELT2 has been disclosed in FIG. 3, the present disclosure is not limited thereto. That is, the number of first electrodes ELT1 and/or second electrodes ELT2 that is provided to each light emitting unit EMU may be changed.

When a plurality of electrodes ELT1 are located in one light emitting unit EMU, the first electrodes ELT1 may be integrally or non-integrally connected to each other. Similarly, when a plurality of second electrodes ELT2 are located in one light emitting unit EMU, the second electrodes ELT2 may be integrally or non-integrally connected to each other.

Each of the first electrode ELT1 and the second electrode ELT2 may have a pattern that is separated for each sub-pixel SPX, or may have a pattern that is commonly connected across a plurality of sub-pixels SPX (or pixels PX). For example, the first electrode ELT1 may have an independent pattern for each sub-pixel SPX, and may be separated from first electrodes ELT1 of adjacent sub-pixels SPX. The second electrode ELT2 may have an independent pattern for each sub-pixel SPX, or may be integrally connected to second electrodes ELT2 of adjacent sub-pixels SPX.

Meanwhile, in a process of forming sub-pixels SPX, for example, before light emitting elements LD are completely aligned, first electrodes ELT1 of the sub-pixels SPX may be connected to each other, and second electrodes ELT2 of the sub-pixels SPX may be connected to each other. For example, before the light emitting elements LD are completely aligned, the first electrodes ELT1 of the sub-pixels SPX may be integrally or non-integrally connected to constitute a first alignment line, and the second electrodes ELT2 of the sub-pixels SPX may be integrally or non-integrally connected to constitute a second alignment line.

The first alignment line and the second alignment line may be respectively supplied with a first alignment signal and a second alignment signal in a process of aligning the light emitting elements LD. The first and second alignment signals may have different wavelengths, potentials, and/or phases. Accordingly, an electric field is formed between the first and second alignment lines, so that the light emitting elements LD can be aligned between the first and second alignment lines. After the light emitting elements LD are completely aligned, the first electrodes ELT1 of the sub-pixels SPX may be separated from each other by cutting at least the first alignment line. Accordingly, the sub-pixels SPX may be individually driven.

The first electrode ELT1 may be electrically connected, through the first contact hole CH1, to at least one circuit element (e.g., at least one transistor constituting a pixel circuit PXC), to a power line (e.g., a first power line PL1), and/or to a signal line (e.g., a scan line SL, a data line DL, or a control line/predetermined control line). In other embodiments, the first electrode ELT1 may be connected directly to a power line (e.g., a predetermined power line) or a signal line (e.g., a predetermined signal line). In some embodiments, the first electrode ELT1 may be connected to a first transistor M1 of the pixel circuit PXC through the first contact hole CH1, and may be connected to the first power line PL1 through the first transistor M1.

The second electrode ELT2 may be electrically connected, through the second contact hole CH2, to at least one circuit element (e.g., at least one transistor constituting the pixel circuit PXC), a power line (e.g., a second power line PL2) and/or a signal line (e.g., a scan line SL, a data line DL, or a control line/predetermined control line). In other embodiments, the second electrode ELT2 may be connected directly to a power line (e.g., a predetermined power line) or a signal line (e.g., a predetermined signal line). In some embodiments, the second electrode ELT2 may be connected to the second power line PL2 through the second contact hole CH2.

Each of the first and second electrodes ELT1 and ELT2 may be configured as a single layer or as a multi-layer. In an example, each of the first and second electrodes ELT1 and ELT2 may include at least one reflective electrode layer including a reflective conductive material, and may selectively further include at least one transparent electrode and/or at least one conductive capping layer.

The light emitting elements LD may be aligned between the first electrode ELT1 and the second electrode ELT2. For example, the light emitting elements LD may be aligned and/or connected in parallel between the first electrode ELT1 and the second electrode ELT2.

In some embodiments, each light emitting element LD may be aligned in the lateral direction (or horizontal direction) between the first electrode ELT1 and the second electrode ELT2 to be electrically connected to the first and second electrodes ELT1 and ELT2. Meanwhile, although a case where all the light emitting elements LD are uniformly aligned in the lateral direction is illustrated in FIG. 3, the present disclosure is not limited thereto. For example, at least one of the light emitting elements LD may be arranged in an oblique direction that is angled/inclined with respect to an extending direction of the first and second electrodes ELT1 and ELT2.

In some embodiments, each light emitting element LD may be an inorganic light emitting diode having a subminiature size (e.g., a size that is nanometer scale to micrometer scale), which uses an inorganic crystal structure. In an example, each light emitting element LD may be a subminiature inorganic light emitting diode manufactured by growing a nitride-based semiconductor and by etching the grown nitride-based semiconductor in a rod shape. However, the kind, size, shape, structure, and/or number of light emitting element(s) LD constituting each light emitting unit EMU may be changed.

Each light emitting element LD may include a first end portion EP1 and a second end portion EP2. The first end portion EP1 may be located adjacent to the first electrode ELT1, and the second end portion EP2 may be located adjacent to the second electrode ELT2. The first end portion EP1 may or may not overlap with the first electrode ELT1. The second end portion EP2 may or may not overlap with the second electrode ELT2.

In some embodiments, the first end portion EP1 of each of the light emitting elements LD may be electrically connected to the first electrode ELT1 through the first contact electrode CNE1. In other embodiments, the first end portion EP1 of each of the light emitting elements LD may be connected directly to the first electrode ELT1. In still other embodiments, the first end portion EP1 of each of the light emitting elements LD is electrically connected to only the first contact electrode CNE1, and might not be connected to the first electrode ELT1. The first contact electrode CNE1 may constitute an anode electrode of the light emitting unit EMU, and the light emitting elements LD may connect to a corresponding pixel circuit PXC through the first contact electrode CNE1.

Similarly, the second end portion EP2 of each of the light emitting elements LD may be electrically connected to the second electrode ELT2 through the second contact electrode CNE2. In other embodiments, the second end portion EP2 of each of the light emitting elements LD may be connected directly to the second electrode ELT2. In still other embodiments, the second end portion EP2 of each of the light emitting elements LD is electrically connected to only the second contact electrode CNE2, and might not be connected to the second electrode ELT2. The second contact electrode CNE2 may constitute a cathode electrode of the light emitting unit EMU, and may connect the light emitting elements LD to the second power line PL2 through the second contact electrode CNE2.

The light emitting elements LD may be prepared in a form in which the light emitting elements LD are dispersed in a solution (e.g., a predetermined solution) to be supplied to an emission area of each sub-pixel SPX through an inkjet printing process, a slit coating process, or the like. When alignment signals (e.g., predetermined alignment signals) are applied to first and second electrodes ELT1 and ELT2 (or first and second alignment lines) of the sub-pixels SPX in a state in which light emitting elements LD are supplied to each emission area, the light emitting elements LD are aligned between the first and second electrodes ELT1 and ELT2. After the light emitting elements LD are aligned, the solution may be removed through a drying process, or the like.

The first contact electrode CNE1 and the second contact electrode CNE2 may be respectively located over the first end portions EP1 and the second end portions EP2 of the light emitting elements LD.

The first contact electrode CNE1 may be located over the first end portions EP1 of the light emitting elements LD to be electrically connected to the first end portions EP1. In some embodiments, the first contact electrode CNE1 may be located on the first electrode ELT1 to be electrically connected to the first electrode ELT1. The first end portions EP1 of the light emitting elements LD may be connected to the first electrode ELT1 through the first contact electrode CNE1.

The second contact electrode CNE2 may be located over the second end portions EP2 of the light emitting elements LD to be electrically connected to the second end portions EP2. In some embodiments, the second contact electrode CNE2 may be located on the second electrode ELT2 to be electrically connected to the second electrode ELT2. The second end portions EP2 of the light emitting element LD may be connected to the second electrode ELT2 through the second contact electrode CNE2.

Figure 4:
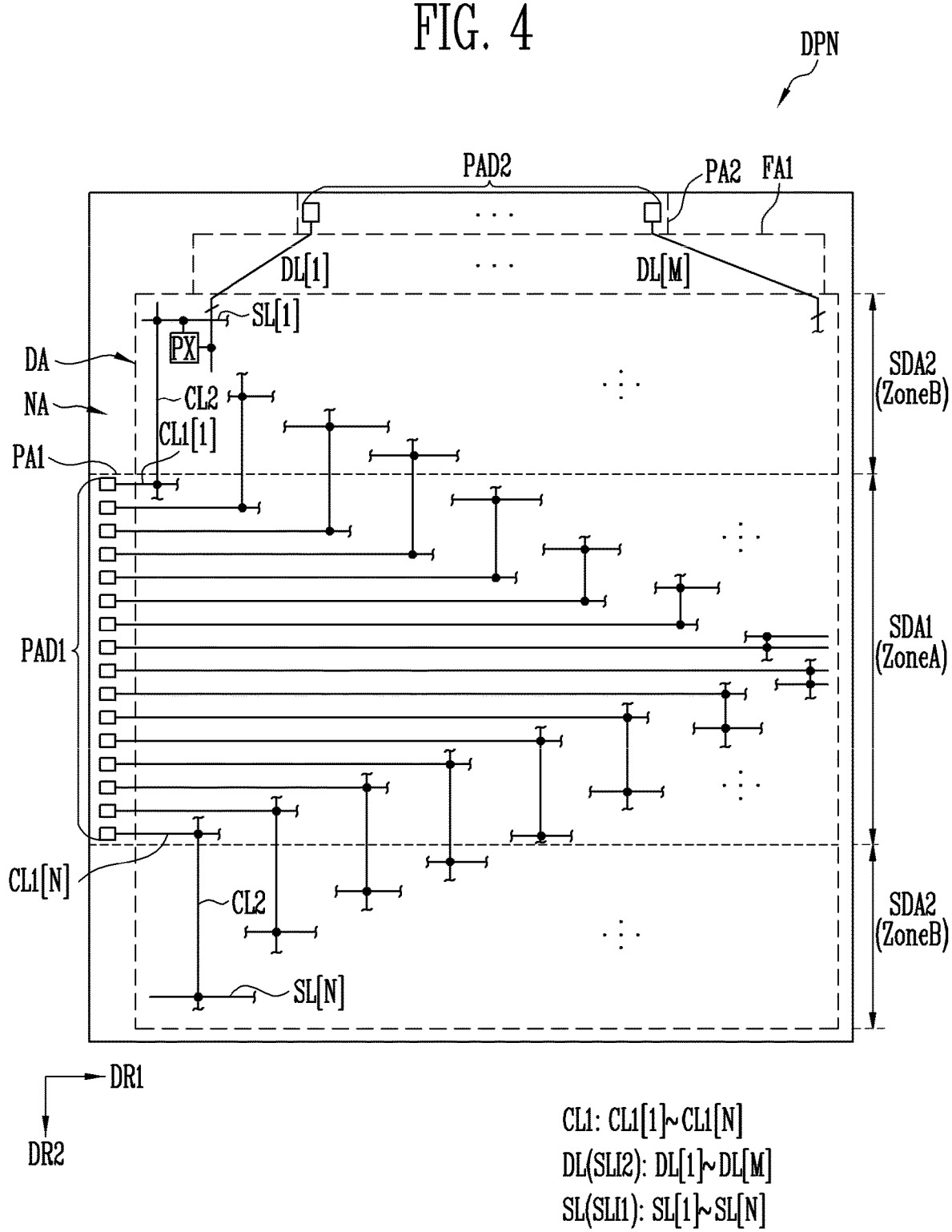
FIG. 4 is a plan view illustrating a display panel in accordance with some embodiments of the present disclosure.

FIG. 4 is a plan view illustrating a display panel DPN in accordance with some embodiments of the present disclosure. For example, FIG. 4 illustrates some embodiments of a display panel DPN which may be provided in the display device DD shown in FIG. 1.

Referring to FIGS. 1 to 4, the display panel DPN may include scan lines SL, data lines DL, and pixels PX, which are arranged in a display area DA, first pads PAD1 arranged in a first pad area PA1 of a non-display area NA, and second pads PAD2 arranged in a second pad area PA2 of the non-display area NA. The non-display area NA is an area excluding the display area DA. In an example, the non-display area NA may be an area located at the periphery of the display area DA.

Also, the display panel DPN may include first lines CL1 extending from the first pad area PA1 to the display area DA, and second lines CL2 connecting the first lines CL1 to first signal lines SLI1 of the display area DA. In some embodiments, the first signal lines SLI1 may include the scan lines SL, and the first pads PAD1 may include scan pads to which scan signals are respectively input. The first and second lines CL1 and CL2 may include connection lines respectively connecting the scan pads to the scan lines SL.

Each of the scan lines SL may extend along a first direction DR1 in the display area DA. Also, the scan lines SL may be sequentially arranged along a second direction DR2 in the display area DA. The first direction DR1 and the second direction DR2 may be directions crossing each other (e.g., orthogonal to each other). In some embodiments, the first direction DR1 may be a lateral direction (e.g., a row direction or a horizontal direction) of the display area DA, and the second direction DR2 may be a longitudinal direction (e.g., a column direction or a vertical direction) of the display area DA. At least one scan line SL may be located on each pixel row, and the scan line SL may be connected to pixels PX of the corresponding pixel row.

The data lines DL, which may also be referred to as second signal lines SLI2, may be arranged in the display area DA to cross the scan lines SL. For example, each of the data lines DL may extend along the second direction DR2 in the display area DA. Also, the data lines DL may be sequentially arranged along the first direction DR1 in the display area DA. For example, at least one data line DL may be located on each pixel column, and the data line DL may be connected to pixels PX of the corresponding pixel column.

Also, the data lines DL may be connected to the respective second pads PAD2. In some embodiments, the data lines DL may extend from the second pad area PA2 to the display area DA via a fan-out area FA1 in which a distance (or pitch) between at least some data lines DL is changed. For example, the data lines DL may be arranged and/or formed in a form in which the data lines DL are spread toward the display area DA such that a distance of one data line DL with adjacent data lines DL is gradually widened in the fan-out area FA1.

The first pad area PA1 may be located at a side of the display area DA in the first direction DR1. In an example, the first pad area PA1 may be located at a left side (or right side) of the display area DA.

The first pad area PA1 may include the first pads PAD1. The first pads PAD1 may be arranged along the second direction DR2 in the first pad area PA1. Besides, the first pad area PA1 may further include an additional component. For example, the first pad area PA1 may further include antistatic circuit elements located between the first pads PAD1 and the display area DA.

The first lines CL1 may be connected to respective first pads PAD1, and may extend from the first pad area PA1 to the display area DA. For example, each first line CL1 may immediately extend from the first pad area PA1 to the display area DA along the first direction DR1. In some embodiments, the first lines CL1 may be arranged along the second direction DR2 at the same pitch as the first pads PAD1 in an area that continues to the display area DA from the first pad area PA1 (e.g., in a boundary area between the first pad area PA1 and the display area DA, which includes an area in which the first pad area PA1 and the display area DA are in contact with each other).

Also, the first lines CL1 may be arranged in only a sub-display area corresponding to a zone corresponding to the first pad area PA1 (e.g., a zone adjacent to the first pad area PA1) at the inside of the display area DA. For example, the display area DA may include a first sub-display area SDA1 corresponding to a zone in which the first pad area PA1 is located (e.g., a zone A, or a first zone, "Zone A," that overlaps with the first pad area PA1 in the second direction DR2), and at least one second sub-display area SDA2 corresponding to another zone (e.g., at least one zone B, or second zone, "Zone B," that does not overlap with the first pad area PA1 in the second direction DR2). Also, in some embodiments, the first lines CL1 may be arranged in only the first sub-display area SDA1 among the first and second sub-display areas SDA1 and SDA2.

In some embodiments, the first pad area PA1 may have a length corresponding to about a half of that of the display area DA (e.g., half of a total longitudinal length of the display area DA) in the second direction DR2, and may be provided at a position corresponding to a central area of the display area DA. A zone length (e.g., a length in the second direction DR2) of the first pad area PA1 may be changed according to a minimum or suitable pitch of the first pads PAD1, etc.

For example, when assuming that 4K (K is a natural number) pixel rows are located in the display area DA, pixel rows corresponding to about a half of the 4K pixel rows (e.g., 2K pixel rows) may be located in the first sub-display area SDA1 corresponding to the position of the first pad area PA1, and the other pixel rows may be dividedly located in two second sub-display areas SDA2 located at respective sides of the first sub-display area SDA1 with respect to the second direction DR2. In an example, K pixel rows may be located in each of the two second sub-display areas SDA2. 4K first lines CL1 for connecting 4K scan lines SL located on the 4K pixel rows may all be located in the first sub-display area SDA1. The 4K first lines CL1 may be respectively connected to scan lines SL located in the first or second sub-display area SDA1 or SDA2 through respective 4K second lines CL2.

The first lines CL1 may be respectively connected to the scan lines SL through the second lines CL2. For example, a first first line CL1[1] connected to a first first pad PAD1 may be connected to any one (e.g., a corresponding one) of the second lines CL2 at the inside of the display area DA, and may be connected to a scan line SL[1] arranged on a first pixel row through the one second line CL2. Similarly, first lines CL1 connected to the other first pads PAD1 may also be respectively connected to scan lines SL arranged on different pixel rows through different second lines CL2. For example, a first line CL1[N] connected to an Nth (N is a natural number) first pad PAD1 may be connected to any one (e.g., a corresponding one) second line CL2 among the second lines CL2 at the inside of the display area DA, and may be connected to an Nth scan line SL[N] arranged on an Nth pixel row through the one second line CL2.

In some embodiments, the first lines CL1 respectively have lengths that are only long enough to be connected between the first pads PAD1 and the second lines CL2, and may have different respective lengths. Alternatively, the first lines CL1 may have lengths substantially equal or similar to each other, regardless of lengths (or distances) between connection points to the respective first pads PAD1 and the respective second lines CL2. For example, the first lines CL1 may extend with an equal length along the first direction DR1 in the first sub-display area SDA1. When the first lines CL1 extend with the equal length, parasitic capacitance formed in the first sub-display area SDA1 can be equalized.

The second lines CL2 may be arranged in the display area DA to cross the first lines CL1 and the scan lines SL, and to connect the first lines CL1 to the respective scan lines SL. For example, each second line CL2 may extend in the second direction DR2 in the display area DA to cross each first line CL1 and each scan line SL. Therefore, the second line CL2 may be connected to the first line CL1 and the scan line SL.

In some embodiments, at least some second lines CL2 may be located in only a sub-display area corresponding to a partial zone of the display area DA, while having a length that is sufficient to respectively connect first lines CL1 and scan lines SL. For example, second lines CL2 connected between scan lines SL located in the first sub-display area SDA1 and first pads PAD1 corresponding thereto are located in only the first sub-display area SDA1, and might not be located in the second sub-display area SDA2.

Alternatively, the second lines CL2 may have lengths substantially equal or similar to each other, regardless of lengths (or distances) between respective connection points to the first lines CL1 and the scan lines SL. For example, the second lines CL2 may extend with a substantially equal length along the second direction DR2 in the display area DA, and may be arranged in the first and second sub-display areas SDA1 and SDA2. In an example, each second line CL2 may pass through both the first and second sub-display areas SDA1 and SDA2. When the second lines CL2 are arranged with a substantially equal length and/or at a substantially equal distance in the display area DA, parasitic capacitance formed in the display area DA can be equalized. Accordingly, a characteristic deviation of the pixels PX can be decreased or prevented.

In accordance with the above, the first lines CL1 can immediately extend from the first pad area PA1 to the display area DA, without locating, between the first pad area PA1 and the display area DA, the fan-out area in which a distance (or pitch) between at least some first lines CL1 is changed (e.g., widened). For example, the first pad area PA1 may be located at a side of the display area DA to be in contact with the display area DA, and the first lines CL1 may extend to the display area DA while passing through the boundary area between the first pad area PA1' and the display area DA at a constant distance. Accordingly, a size of the non-display area NA (e.g., a left non-display area and/or a right non-display area of the display panel DPN) of the display device DD can be reduced.

Meanwhile, although a structure in which the first pads PAD1 and the scan lines SL are connected to each other by using the first and second lines CL1 and CL2 has been described according to some embodiments, as shown in FIG. 4, the first signal lines SLI1 connected to the first pads PAD1 by the first and second lines CL1 and CL2 are not limited to the scan lines SL. For example, when other gate lines (e.g., emission control lines, initialization control lines, and/or sensing control lines) in addition to the scan lines SL are further located in the display area DA, the other gate lines may be connected to the respective first pads PAD1 through connection lines in the first direction DR1 and through connection lines in the second direction DR2 in a manner identical or similar to the scan lines SL.

The second pad area PA2 may be located at a side of the display area DA in the second direction DR2. For example, the second pad area PA2 may be located at an upper side (or lower side) of the display area DA.

The second pad area PA2 may include the second pads PAD2. The second pads PAD2 may be arranged along the first direction DR1 in the second pad area PA2.

The second pads PAD2 may be connected to the respective data lines DL. For example, a first second pad PAD2 may be connected to a first data line DL[1] (or first sub-data line), and an Mth (M is a natural number) second pad PAD2 may be connected to an Mth data line DL[M] (or Mth sub-data line).

Figure 5:
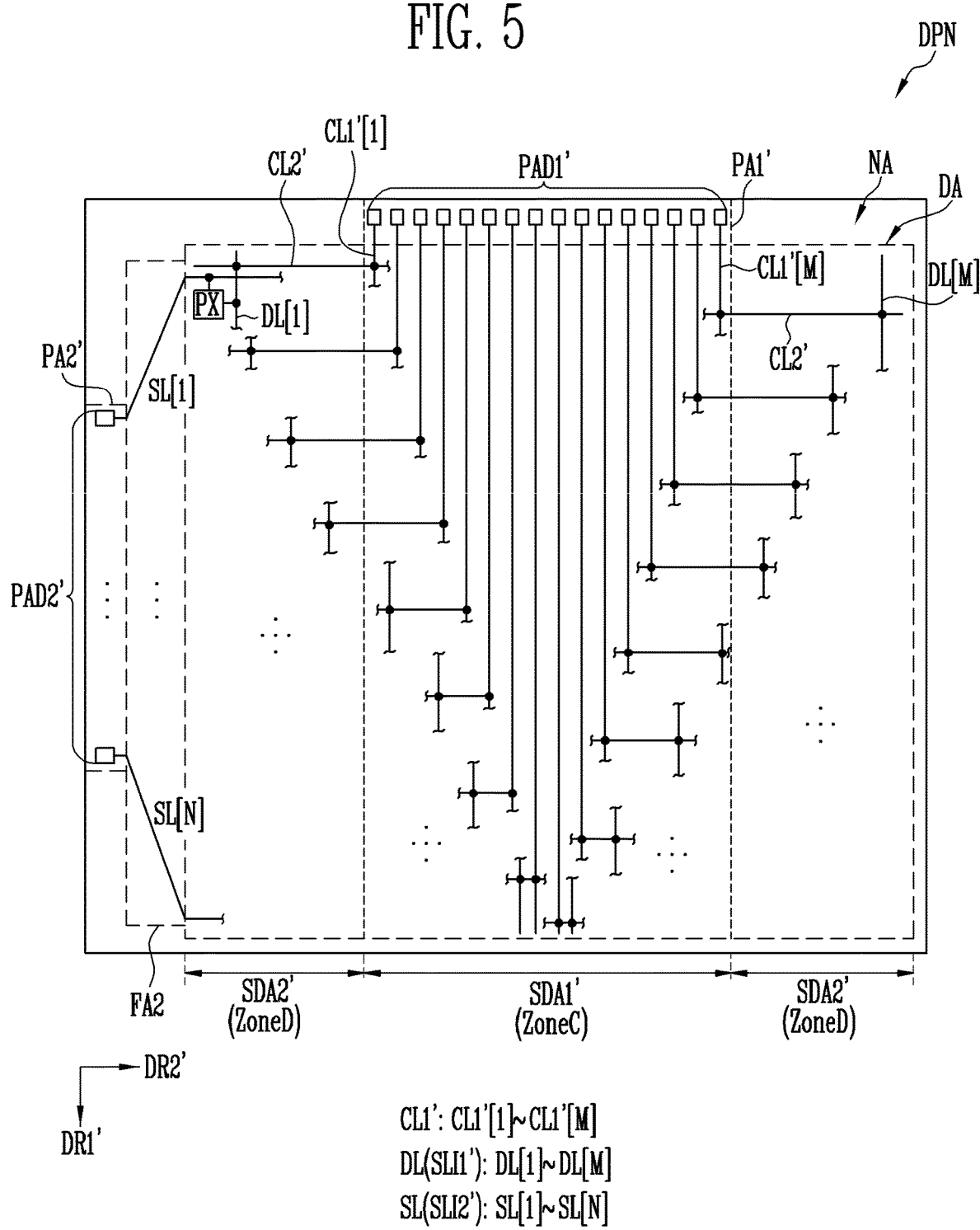
FIG. 5 is a plan view illustrating a display panel in accordance with some embodiments of the present disclosure.

FIG. 5 is a plan view illustrating a display panel DPN in accordance with some embodiments of the present disclosure. For example, FIG. 5 illustrates some embodiments of a display panel DPN which may be provided in the display device DD shown in FIG. 1.

Referring to FIGS. 1, 2, and 5, the display panel DPN may include scan lines SL, data lines DL, and pixels PX, which are arranged in a display area DA, first pads PAD1' arranged in a first pad area PA1' of a non-display area NA, and second pads PAD2' arranged in a second pad area PA2' of the non-display area NA.

Also, the display panel DPN may include first lines CL1' extending from the first pad area PA1' to the display area DA, and second lines CL2' connecting the first lines CL1' to first signal lines SLI1' of the display area DA. In some embodiments, the first signal lines SLI1' may include the data lines DL, and the first pads PAD1' may include data pads to which data signals are respectively input. The first and second lines CL1' and CL2' may be connection lines respectively connecting the data pads to the data lines DL.

Each of the scan lines SL (also, referred to as second signal lines SLI2) may extend along a second direction DR2' in the display area DA. Also, the scan lines SL may be sequentially arranged along a first direction DR1' in the display area DA. The first direction DR1' and the second direction DR2' may be directions crossing each other (e.g., orthogonal to each other). In some embodiments, the first direction DR1' may be a longitudinal direction (e.g., a column direction or a vertical direction) of the display area DA, and the second direction DR2' may be a lateral direction (e.g., a row direction or a horizontal direction) of the display area DA. At least one scan line SL may be located on each pixel row, and the scan line SL may be connected to pixels PX of the corresponding pixel row.

Also, the scan lines SL may be connected to the respective second pads PAD2'. In some embodiments, the scan lines SL may extend from the second pad area PA2' to the display area DA via a fan-out area FA2 in which a distance (or pitch) between at least some scan lines SL is changed. For example, the scan lines SL may be arranged and/or formed in a form in which the scan lines SL are spread toward the display area DA such that a distance between adjacent scan lines SL is gradually widened in the fan-out area FA2 (e.g., toward the display area DA).

The data lines DL may be arranged in the display area DA to cross the scan lines SL. For example, each of the data lines DL may extend along the first direction DR1'. Also, the data lines DL may be sequentially arranged along the second direction DR2' in the display area DA. At least one data line DL may be located on each pixel column, and the data line DL may be connected to pixels PX of the corresponding pixel column.

The first pad area PA1' may be located at a side of the display area DA in the first direction DR1'. In an example, the first pad area PA1' may be located at an upper side (or lower side) of the display area DA.

The first pad area PA1' may include the first pads PAD1'. The first pads PAD1' may be arranged along the second direction DR2' in the first pad area PA1'. In some embodiments, the first pad area PA1' may further include an additional component. For example, the first pad area PA1' may further include antistatic circuit elements located between the first pads PAD1' and the display area DA.

The first lines CL1' may be connected to the respective first pads PAD1', and may extend from the first pad area PA1' to the display area DA. For example, each first line CL1' may immediately extend from the first pad area PA1' to the display area DA along the first direction DR1'. In some embodiments, the first lines CL1' may be arranged along the second direction DR2' at the same pitch as the first pads PAD1' in an area continued to, or connected to, the display area DA from the first pad area PA1' (e.g., a boundary area between the first pad area PA1' and the display area DA, which includes an area in which the first pad area PA1' and the display area DA are in contact with each other).

Also, the first lines CL1' may be arranged in only a sub-display area corresponding to a zone corresponding to the first pad area PA1' (e.g., a zone adjacent to the first pad area PA1') at the inside of the display area DA. For example, the display area DA may include a first sub-display area SDA1' corresponding to a zone in which the first pad area PA1' is located (e.g., a zone C "Zone C" overlapping with the first pad area PA1' in the first direction DR1'), and at least one second sub-display area SDA2' corresponding to one or more other zones (e.g., at least one zone D "Zone D" that does not overlap with the first pad area PA1' in the first direction DR1', or located on either or both sides of the zone C "Zone C" with respect to the second direction DR2'). Also, the first lines CL1' may be arranged in only the first sub-display area SDA1' among the first and second sub-display areas SDA1' and SDA2'.

In some embodiments, the first pad area PA1' may have a length corresponding to about a half of the length of the display area DA (e.g., a lateral length of the display area DA) in the second direction DR2', and may be provided at a position generally corresponding to a central area of the display area DA. A zone length (e.g., a length in the second direction DR2') of the first pad area PA1' may be changed according to a suitable or minimum pitch of the first pads PAD1', etc.

For example, when assuming that 4L (L is a natural number) pixel columns are located in the display area DA, pixel columns corresponding to about a half of the 4L pixel columns (e.g., 2L pixel columns) may be located in the first sub-display area SDA1' corresponding to "Zone C" in which the first pad area PA1' is located, and the other pixel columns may be dividedly located in two second sub-display areas SDA2' located at respective sides of the first sub-display area SDA1' with respect to the second direction DR2'. In an example, L pixel columns may be located in each of the two second sub-display areas SDA2'. 4L (or 4L*P (P being a number of sub-pixels SPX located on each pixel column) first lines CL1' for connecting 4L data lines DL (or 4L*P sub-data lines) corresponding to the 4L pixel columns all may be located in the first sub-display area SDA1'. The 4L (or 4L*P) first lines CL1' may be respectively connected to data lines DL located in the first or second sub-display area SDA1' or SDA2' through different second lines CL2'.

Additionally, when assuming that Q (Q is a natural number) sensing lines SENL are located in the display area DA, sensing pads connected to the respective sensing lines SENL may be further located in the first pad area PAD1'. In addition, first and second sensing connection lines respectively extending in the first direction DR1' and the second direction DR2' may be further located in the display area DA to connect the sensing lines SENL to the respective sensing pads. The sensing pads may be connected to the respective sensing lines SENL via the first and second sensing connection lines in a manner similar to that of the first pads PAD1'.

The first lines CL1' may be respectively connected to the data lines DL through the second lines CL2'. For example, a first first line CL1'[1] connected to a first first pad PAD1' may be connected to any one (e.g., a corresponding one) of the second lines CL2' at the inside of the display area DA, and may be connected to a data line DL[1] (or first sub-data line) corresponding to a first pixel column through the corresponding second line CL2'. Similarly, first lines CL1' connected to the other first pads PAD1' may also be connected to different data lines DL through different second lines CL2'. For example, a first line (e.g., an Mth first line) CL1'[M] connected to an Mth (M is a natural number) first pad PAD1' may be connected to any one (e.g., a corresponding one) second line CL2' among the second lines CL2' at the inside of the display area DA, and may be connected to an Mth data line DL[M] (or Mth sub-data line) through the one second line CL2'.

In some embodiments, the first lines CL1' respectively have lengths effectively just long enough to enable connection to the first pads PAD1' and to the second lines CL2', and may have different respective lengths. Alternatively, the first lines CL1' may have lengths substantially equal or similar to each other. For example, the first lines CL1' may extend with an equal length along the first direction DR1' in the first sub-display area SDA1'. When the first lines CL1' extend with the equal length, parasitic capacitance formed in the first sub-display area SDA1' can be equalized.

The second lines CL2' may be arranged in the display area DA to cross the first lines CL1' and the data lines DL, and may connect the first lines CL1' to the respective data lines DL. For example, each second line CL2' may extend in the second direction DR2' in the display area DA to cross each first line CL1' and each data line DL. Therefore, the second line CL2' may be connected to the first line CL1' and the data line DL.

In some embodiments, at least some second lines CL2' may be located in only a sub-display area corresponding to a partial zone of the display area DA, while having a length that is sufficient to respectively connect first lines CL1' and data lines DL. For example, first lines CL1' connected between data lines DL located in the first sub-display area SDA1' and first pads PAD1' corresponding thereto are located in only the first sub-display area SDA1', and might not be located in the second sub-display area SDA2'.

Alternatively, the second lines CL2' may have lengths substantially equal or similar to each other in the display area DA. For example, the second lines CL2' may extend with an equal length along the second direction DR2' in the display area DA, and may be arranged in the first and second sub-display areas SDA1' and SDA2'. In an example, each second line CL2' may pass through both the first and second sub-display areas SDA1' and SDA2'. When the second lines CL2' are arranged with an equal length and/or at an equal distance in the display area DA, parasitic capacitance formed in the display area DA can be equalized.

In accordance with the above, the first lines CL1' can immediately extend from the first pad area PA1' to the display area DA, without locating the fan-out area, in which a distance (or pitch) between at least some first lines CL1' is changed (e.g., widened), between the first pad area PA1' and the display area DA. For example, the first pad area PA1' may be located at a side of the display area DA to be in contact with the display area DA, and the first lines CL1' may extend to the display area DA while passing through the boundary area between the first pad area PA1' and the display area DA at a constant distance from each other. Accordingly, the non-display area NA (e.g., a left non-display area and/or a right non-display area of the display panel DPN) of the display device DD can be reduced.

The second pad area PA2' may be located at a side of the display area DA in the second direction DR2'. For example, the second pad area PA2' may be located at a left side (or right side) of the display area DA.

The second pad area PA2' may include the second pads PAD2'. The second pads PAD2' may be arranged along the first direction DR1' in the second pad area PA2'.

The second pads PAD2' may be connected to the respective data lines DL. For example, a first second pad PAD2' may be connected to a first scan line SL[1], and an Nth second pad PAD2' may be connected to an Nth scan line SL[N].

Figure 6:
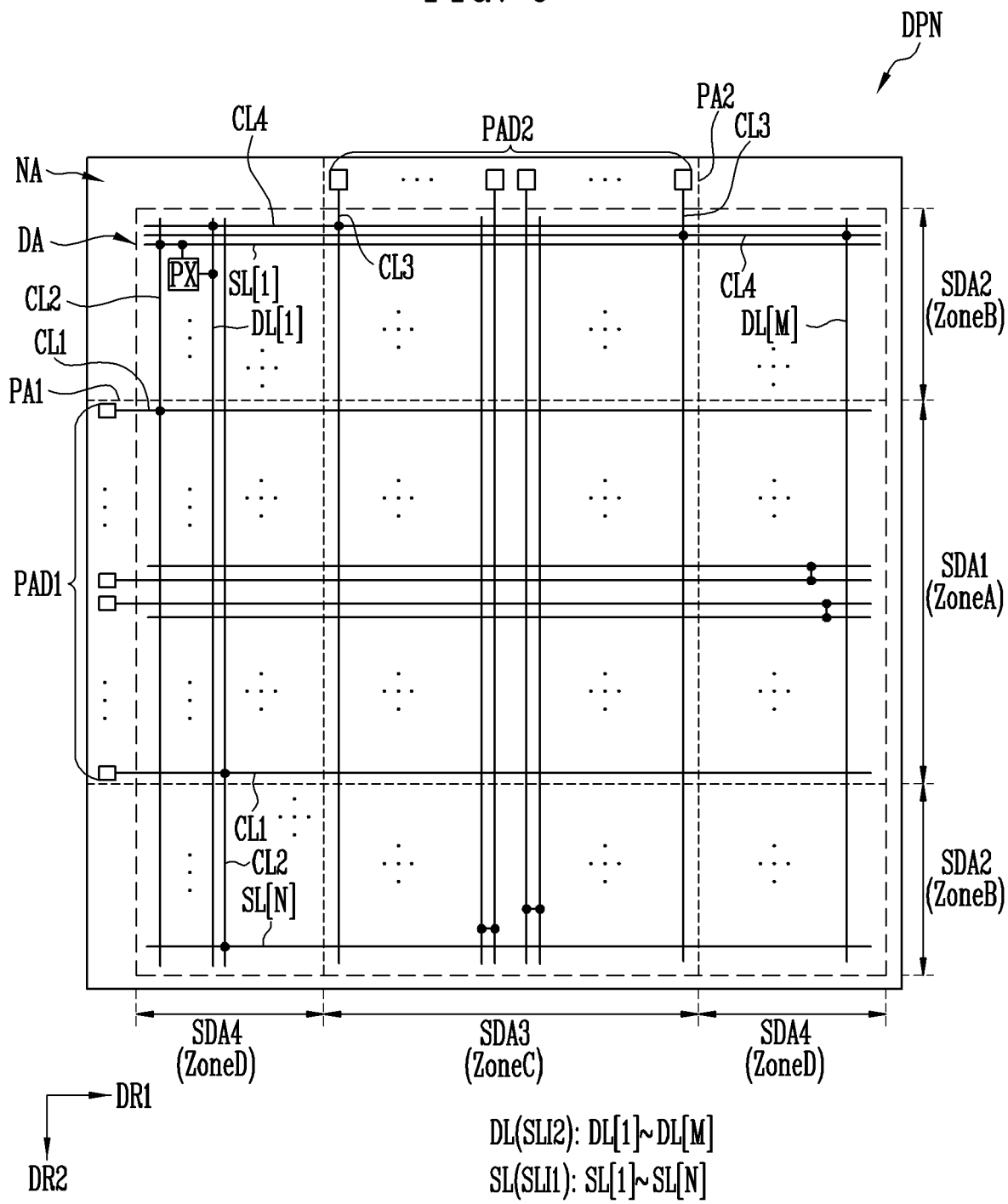
FIG. 6 is a plan view illustrating a display panel in accordance with some embodiments of the present disclosure.

FIG. 6 is a plan view illustrating a display panel DPN in accordance with some embodiments of the present disclosure. For example, FIG. 6 illustrates some embodiments of a display panel DPN, which may be provided in the display device DD shown in FIG. 1. In some embodiments shown in FIG. 6, detailed descriptions of components similar or identical to those of the above-described embodiments (e.g., the embodiments shown in FIGS. 4 and 5) will be omitted.

Referring to FIGS. 1 to 6, first pads PAD1 may be connected to scan lines through first and second lines CL1 and CL2, and second pads PAD2 may be connected to data lines DL through third and fourth lines CL3 and CL4, without locating any fan-out area between a first pad area PA1 and a display area DA or between a second pad area PA2 and the display area DA, the fan-out area being an area in which a distance (or pitch) between the first lines CL1 or the third lines CL3 is changed (e.g., widened). For example, the first lines CL1 and the third lines CL3 may immediately extend to the display area DA respectively from the first pad area PA1 and the second pad area PA2, and may be arranged at a constant distance (e.g., may have a constant pitch) respectively in a boundary area between the first pad area PA1 and the display area DA and in a boundary area between the second pad area PA2 and the display area DA. In addition, the second lines CL2 may be connected between the first lines CL1 and the scan lines SL, and the fourth lines CL4 may be connected between the third lines CL3 and the data lines DL.

In some embodiments, as shown in FIG. 6, the scan lines SL may be first signal lines SLI1 connected to pixels PX, and the data lines DL may be second signal lines SLI2 connected to the pixels PX. The first pad area PA1, a first sub-display area SDA1, and a second sub-display area SDA2, which are shown in FIG. 6, may be components respectively corresponding to the first pad area PA1, the first sub-display area SDA1, and the second sub-display area SDA2 that are shown in FIG. 4. The second pad area PA2, a third sub-display area SDA3, and a fourth sub-display area SDA4, which are shown in FIG. 6, may be components respectively corresponding to the first pad area PA1', the first sub-display area SDA1', and the second sub-display area SDA2' that are shown in FIG. 5. Similarly, the first pads PAD1, the first lines CL1, and the second lines CL2, which are shown in FIG. 6, may be components respectively corresponding to the first pads PAD1, the first lines CL1, and the second lines CL2 that are shown in FIG. 4, while the second pads PAD2, the third lines CL3, and the fourth lines CL4, which are shown in FIG. 6, may be components respectively corresponding to the first pads PAD1', the first lines CL1', and the second lines CL2' that are shown in FIG. 5.

The first pad area PA1 may be located at a side of the display area DA in a first direction DR1, and the first pads PAD1 may be arranged along a second direction DR2 in the first pad area PA1. The first pads PAD1 may be connected to the respective first lines CL1. In some embodiments, the first direction DR1 may be a lateral direction (e.g., a row direction or a horizontal direction) of the display area DA, and the second direction DR2 may be a longitudinal direction (e.g., a column direction or a vertical direction) of the display area DA.

The first lines CL1 may extend from the first pad area PA1 to the display area DA along the first direction DR1. At the inside of the display area DA, the first lines CL1 are located in the first sub-display area SDA1, and might not be located in the second sub-display area SDA2.

The first sub-display area SDA1 may be a sub-display area corresponding to a zone A "Zone A" in which the first pad area PA1 is located with respect to the second direction DR2, and the second sub-display area SDA2 may be a sub-display area corresponding to one or more other zones (e.g., one or more zones B "Zone B") with respect to the second direction DR2. In some embodiments, the first lines CL1 may be arranged along the second direction DR2 at the same pitch as the first pads PAD1 in an area continuing to the display area DA from the first pad area PA1. The first lines CL1 may be connected to the respective second lines CL2.

The second lines CL2 may be arranged in the display area DA to cross the first lines CL1 and the scan lines SL. Therefore, the second lines CL2 may connect the first lines CL1 to the respective scan lines SL. For example, each of the second lines CL2 may extend in the second direction DR2, and the second lines CL2 may be respectively connected to the first lines CL1 and the scan lines SL at points at which the second lines CL2 cross the first lines CL1 and the scan lines SL.

The second pad area PA2 may be located at a side of the display area DA with respect to the second direction DR2, and the second pads PAD2 may be arranged along the first direction DR1 in the second pad area PA2. The second pads PAD2 may be connected to the respective third lines CL3.

The third lines CL3 may extend from the second pad area PA2 to the display area DA along the second direction DR2. At the inside of the display area DA, the third lines CL3 are located in the third sub-display area SDA3, and might not be located in the fourth sub-display area SDA4.

The third sub-display area SDA3 may be a sub-display area corresponding to a zone C "Zone C" corresponding to the second pad area PA2, and the fourth sub-display area SDA4 may be a sub-display area corresponding to one or more other zones excluding Zone C with respect to the first direction DR1. For example, the third sub-display area SDA3 may be a sub-display area corresponding to Zone C correspond to the second pad area PA2 with respect to the first direction DR1, and the fourth sub-display area SDA4 may be a sub-display area corresponding to a zone D "Zone D" separate from and adjacent to Zone C in the first direction DR1. In some embodiments, the third lines CL3 may be arranged along the first direction DR1 at the same pitch as the second pads PAD2 in an area continuing to the display area DA from the second pad area PA2. The third lines CL3 may be respectively connected to the fourth lines CL4.

The fourth lines CL4 may be arranged in the display area DA to cross the third lines CL3 and the data lines DL. Therefore, the fourth lines CL4 may connect the third lines CL3 to the respective data lines DL. For example, each of the fourth lines CL4 may extend in the first direction DR1, and the fourth lines CL4 may be respectively connected to the third lines CL3 and the data lines DL at respective points at which the fourth lines CL4 cross the third lines CL3 and the data lines DL.

Figure 7:
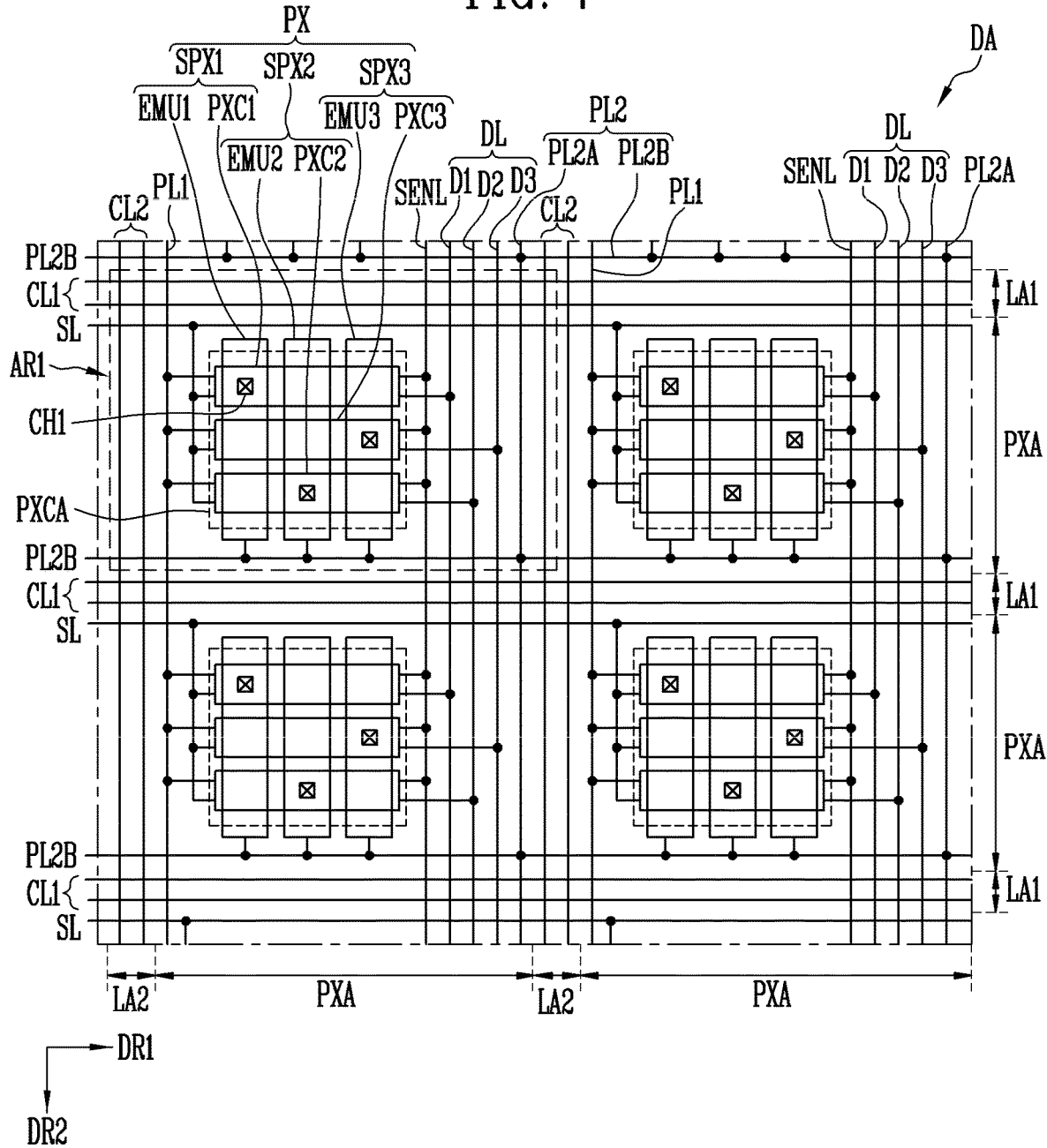
FIG. 7 is a plan view illustrating a display area in accordance with some embodiments of the present disclosure.

FIG. 7 is a plan view illustrating a display area DA in accordance with some embodiments of the present disclosure. For example, FIG. 7 illustrates a portion of the display area DA (e.g., the first sub-display area SDA1) including the first lines CL1 and the second lines CL2 in accordance with some embodiments shown in FIG. 4. In FIG. 7, the display area will be described based on four pixel areas PXA in which four pixels PX are arranged, and based on portions of first and second line areas LA1 and LA2 located at the periphery of the pixel areas PXA.

In some embodiments, the first line areas LA1 and the second line areas LA2 might not overlap with the pixel areas PXA in which the pixels PX are respectively located. For example, each of the first line areas LA1 and the second line areas LA2 might not overlap with pixel circuits PXC and light emitting units EMU of adjacent pixels PX. In other embodiments, at least one of the first line areas LA1 and the second line areas LA2 may overlap with at least one adjacent pixel area PXA. For example, the first line areas LA1 and/or the second line areas LA2 may partially overlap with light emitting units EMU of adjacent pixels PX.

In FIG. 7, a structure of the display area DA in accordance with some embodiments of the present disclosure will be described by assuming that each pixel area PXA includes a scan line SL, a data line DL, a sensing line SENL, a first power line PL1, and/or a second power line PL2, which correspond thereto. However, scan lines SL, data lines DL, sensing lines SENL, first power lines PL1, and/or second power lines PL2 may be considered as components that are not located in the pixel areas PXA, but instead are located together with the first lines CL1 and/or the second lines CL2 in the first line areas LA1 and/or the second line areas LA2. That is, each pixel area PXA may be an area including pixel circuits PXC and light emitting units EMU of sub-pixels SPX constituting a corresponding pixel PX, and may be an area selectively including at least one signal line and/or at least one power line, connected to the sub-pixels SPX.

Referring to FIGS. 1 to 7, the display area DA may include pixel areas PXA in which pixels PX are respectively located and/or formed, and first line areas LA1 and second line areas LA2, which are respectively located between adjacent pixel areas PXA.

Each pixel PX may include a plurality of sub-pixels SPX. In an example, each pixel PX may include a first sub-pixel SPX1, a second sub-pixel SPX2, and a third sub-pixel SPX3. The pixel area PXA in which the pixel PX is formed may include an area in which pixel circuits PXC and light emitting units EMU of the sub-pixels SPX are formed.

In case that each pixel PX includes a plurality of sub-pixels SPX, a plurality of sub-data lines may be formed on each pixel column. For example, each data line DL may include a first sub-data line D1 connected to first sub-pixels SPX1 of a corresponding pixel column, a second sub-data line D2 connected to second sub-pixels SPX2 of the corresponding pixel column, and a third sub-data line D3 connected to third sub-pixels SPX3 of the corresponding pixel column.

Each sub-pixel SPX may include a pixel circuit PXC and a light emitting unit EMU. For example, the first sub-pixel SPX1 may include a first pixel circuit PXC1 and a first light emitting unit EMU1, the second sub-pixel SPX2 may include a second pixel circuit PXC2 and a second light emitting unit EMU2, and the third sub-pixel SPX3 may include a third pixel circuit PXC3 and a third light emitting unit EMU3. The pixel circuits PXC of the sub-pixels SPX may be located in a pixel circuit layer (e.g., pixel circuit PCL shown in FIG. 8) of each pixel area PXA, and the light emitting units EMU of the sub-pixels SPX may be located in a display layer (e.g., display layer DPL shown in FIG. 8) of each pixel area PXA to overlap with the respective pixel circuits SPX.

The first, second, and third pixel circuits PXC1, PXC2, and PXC3 may be located in a pixel circuit area PXCA of a pixel area PXA, and may be arranged along a second direction DR2. In some embodiments, the third pixel circuit PXC3 may be located in the middle of the pixel circuit area PXCA with respect to the second direction DR2, and the first and second pixel circuits PXC1 and PXC2 may be located at respective sides of the third pixel circuit PXC3 in the second direction DR2. However, the positions and/or arrangement sequence of the first, second, and third pixel circuits PXC1, PXC2, and PXC3 may be changed in some embodiments.

The first, second, and third pixel circuits PXC1, PXC2, and PXC3 may be commonly connected to a respective scan line SL (e.g., a scan line SL of a respective pixel row), and may be connected to different data lines. For example, the first pixel circuit PXC1 may be connected to a first sub-data line D1, the second pixel circuit PXC2 may be connected to the second sub-data line D2, and the third pixel circuit PXC may be connected to the third sub-data line D3.

In addition, in case that each pixel circuit PXC is further connected to the sensing line SENL, as shown in FIG. 2, the display area DA may further include sensing lines SENL respectively formed on at least one pixel column. For example, one sensing line SENL may be formed for each pixel column. The sensing line SENL may be commonly connected to pixel circuits PXC of the corresponding pixel column.

The first, second, and third pixel circuits PXC1, PXC2, and PXC3 may be commonly connected to the first power line PL1. In some embodiments, the first power line PL1 may be formed for each pixel column, and may extend along the second direction DR2. However, the present disclosure is not limited thereto.

The first, second, and third pixel circuits PXC1, PXC2, and PXC3 may be connected to the first, second, and third light emitting units EMU1, EMU2, and EMU3 through first contact holes CH1, respectively.

The first, second, and third light emitting units EMU1, EMU2, and EMU3 may be connected to the respective pixel circuits PXC and the second power line PL2. In some embodiments, the second power line PL2 may include a 2Ath power line PL2A formed for each pixel column, and a 2Bth power line PL2B formed for each of at least one pixel row. The 2Ath power line PL2A and the 2Bth power line PL2B may be connected to each other.

The first, second, and third light emitting units EMU1, EMU2, and EMU3 may be arranged along a first direction DR1 in each pixel area PXA. In some embodiments, the first, second, and third light emitting units EMU1, EMU2, and EMU3 may be sequentially located along the first direction DR1. The first, second, and third light emitting units EMU1, EMU2, and EMU3 may or may not overlap with at least one signal line (e.g., a respective scan line SL, a respective data line DL, and/or a respective sensing line SENL) and/or at least one power line (e.g., the first power line PL1 and/or the second power line PL2). Also, the first, second, and third light emitting units EMU1, EMU2, and EMU3 may or may not overlap with at least one first line CL1 and/or at least one second line CL2.

Meanwhile, although some embodiments in which the pixel circuits PXC and the light emitting units EMU of the sub-pixels SPX are arranged along different directions has been disclosed, as shown in FIG. 7, the present disclosure is not limited thereto. For example, the pixel circuits PXC and the light emitting units EMU of the sub-pixels SPX are respectively located in the pixel circuit layer and the display layer, and may be arranged in various manners to efficiently use a space of each layer.

In an example, the pixel circuits PXC may be respectively located in circuit areas at positions at which the pixel circuits PXC can be connected to the light emitting units EMU, and may be compactly designed such that the area of each pixel circuit PXC is reduced or optimized in each pixel area PXA of the pixel circuit layer. Accordingly, the use of spaces of the pixel circuit layer can be increased. For example, when the pixel circuit area PXCA is reduced, a line space for forming first line areas LA1 (e.g., lateral line areas) between adjacent pixel rows may be ensured, and at least one first line CL1 may be formed in each first line area LA1. Similarly, a line space for forming second line areas LA2 between adjacent pixel columns may be ensured, and at least one second line CL2 may be formed in each second line area LA2.

The first line areas LA1 may be located between at least some of adjacent pixel rows among the pixel rows located in the display area DA, and each of the first line areas LA1 may extend in the first direction DR1. In an example, each first line area LA1 may be located between pixel circuit areas PXCA of two adjacent pixel rows.

For example, when the first lines CL1 are located in the first sub-display area SDA1, as shown in FIG. 4, the first line areas LA1 may be located in an area between pixel rows arranged in the first sub-display area SDA1 and/or a boundary area between the first and second sub-display areas SDA1 and SDA2, and the first lines CL1 may be dividedly formed in the first line areas LA1. Meanwhile, when the first lines CL1' extend along the longitudinal direction as shown in FIG. 5, first line areas in the longitudinal direction (e.g., longitudinal line areas) may be located in an area between pixel columns arranged in the first sub-display area SDA1' and/or in a boundary area between the first and second sub-display areas SDA1' and SDA2', and the first lines CL1' may be dividedly formed in the first line areas in the longitudinal direction.

The first lines CL1 may extend along the first direction DR1 in each of the first line areas LA1. For example, each of the first lines CL1 may extend along the first direction DR1 at the inside of the display area DA, and the first lines CL1 may be arranged substantially in parallel to each other. Each first line CL1 may be connected to any second line CL2 corresponding thereto in an area overlapping with the second line CL2 (e.g., an area in which the first line CL1 crosses the second line CL2).

In some embodiments, the first lines CL1 may be located to be spaced apart from scan lines SL in the same layer as the scan lines SL. Meanwhile, when the first lines CL1' extend along the same direction as data lines DL, as shown in FIG. 5, the first lines CL1' may be located to be spaced apart from the data lines DL in the same layer as the data lines DL.

The second line areas LA2 may be located between at least some adjacent pixel columns among the pixel columns located in the display area DA, and each of the second line areas LA2 may extend along the second direction DR2. In an example, each second line area LA2 may be located between pixel circuit areas PXCA of two adjacent pixel columns.

For example, second line areas LA2 (e.g., longitudinal line areas) may be located between at least some adjacent pixel columns located in the display area DA, and the second lines CL2 may be dividedly located in the second line areas LA2. Meanwhile, when the second lines CL2' extend along the lateral direction, as shown in FIG. 5, second line areas in the lateral direction (e.g., lateral line areas) between at least some adjacent pixel rows among the pixel rows located in the display area DA may be ensured, and the second lines CL2' may be dividedly located in the second line areas in the lateral direction.

The second lines CL2 may extend along the second direction DR2 in each of the second line areas LA2. For example, each of the second lines CL2 may extend along the second direction DR2 at the inside of the display area DA, and the second lines CL2 may be arranged substantially in parallel to each other. The second lines CL2 may be connected to the first lines CL1 in areas in which the first line areas LA1 and the second line areas LA2 cross each other.

In some embodiments, the second lines CL2 may be located to be spaced apart from data lines DL in the same layer as the data lines DL. Meanwhile, when the second lines CL2' extend along the same direction as scan lines SL, as shown in FIG. 5, the second lines CL2' may be located to be spaced apart from the scan lines SL in the same layer as the scan lines SL.

Figure 8:
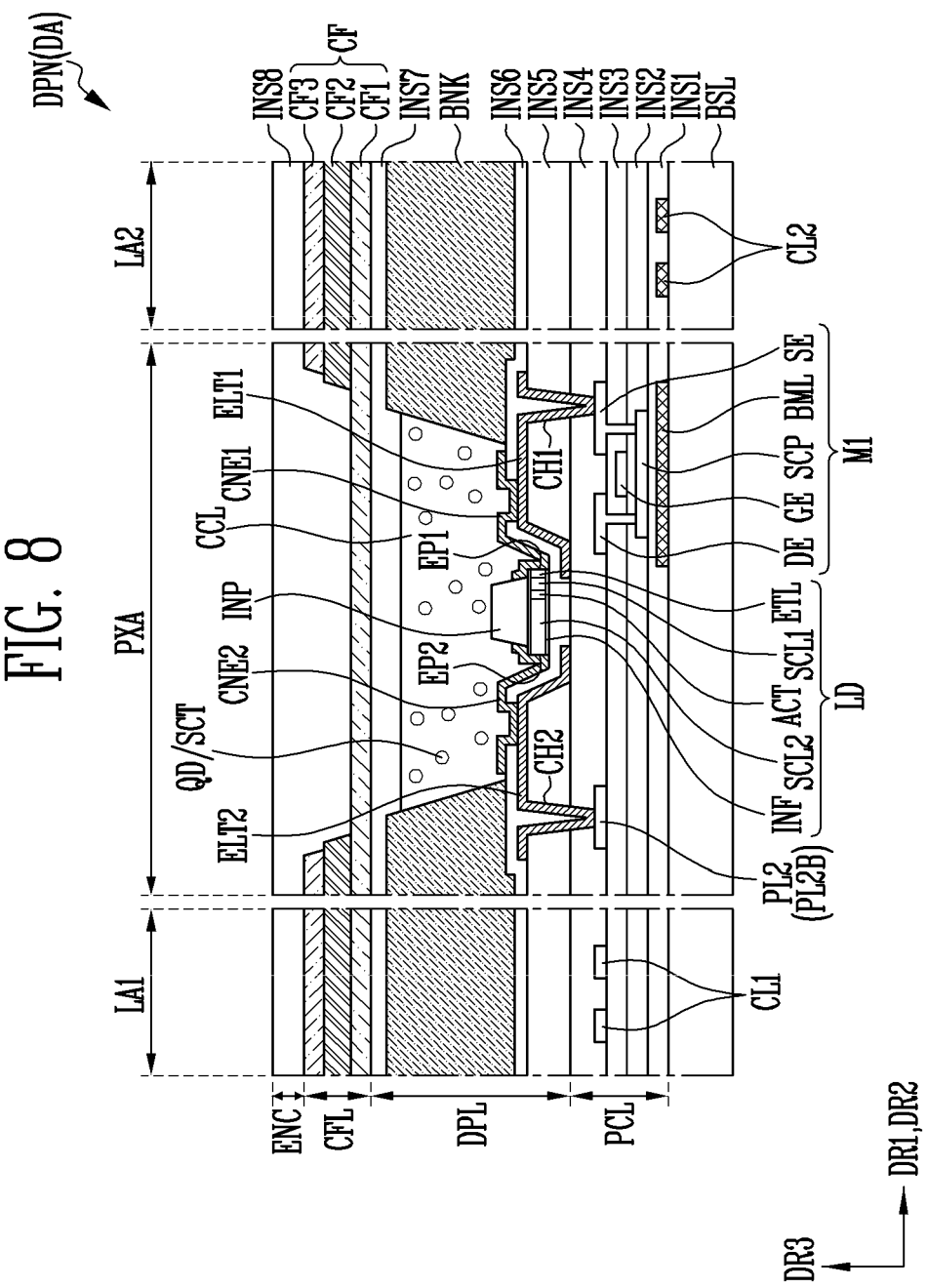
FIG. 8 is a sectional view illustrating a display panel in accordance with some embodiments of the present disclosure.

FIG. 8 is a sectional view illustrating a display panel DPN in accordance with some embodiments of the present disclosure. For example, FIG. 8 illustrates a section of the display panel DPN based on any pixel area PXA, first line area LA1, and second line area LA2 located in a display area DA. In addition, when a section of a pixel area PXA is disclosed, a section of any one sub-pixel SPX (e.g., a first sub-pixel SPX) located in the pixel area PXA is schematically illustrated. Sub pixels SPX have sectional structures that are substantially similar to each other, and the sizes, positions, and/or shapes of circuit elements constituting each sub-pixel SPX, and electrodes included in the circuit elements, may be changed in other embodiments.

In FIG. 8, a first transistor M1 provided in any one sub-pixel SPX is illustrated as an example of pixel elements that may be located in a pixel circuit layer PCL, and a second power line PL2 (e.g., the 2Bth power line PL2B) connected to a light emitting unit EMU of the sub-pixel SPX is illustrated as an example of a line that may be located in the pixel circuit layer PCL. Also, in FIG. 8, a plurality of first lines CL1 and a plurality of second lines CL2, which are respectively located in a first line area LA1 and in a second line area LA2, are illustrated as an example of the line that may be located in the pixel circuit layer PCL.

Referring to FIGS. 1 to 8, the display panel DPN may include a base layer BSL, a pixel circuit layer PCL, and a display layer DPL. The pixel circuit layer PCL and the display layer DPL may be located on the base layer BSL to overlap with each other. In an example, the pixel circuit layer PCL and the display layer DPL may be sequentially located on one surface of the base layer BSL.

Also, the display panel DPN may further include a color filter layer CFL and/or an encapsulation layer ENC (or protective layer) on the display layer DPL. In some embodiments, the color filter layer CFL and/or the encapsulation layer ENC may be formed above or directly on a surface of the base layer BSL on which the pixel circuit layer PCL and the display layer DPL are formed, but the present disclosure is not limited thereto.

Pixel circuits PXC constituting sub-pixels SPX of each pixel PX may be formed in each pixel area PXA of the pixel circuit layer PCL. For example, a plurality of circuit elements including first transistors M1 of the sub-pixels SPX may be formed in each pixel circuit area PXCA. In some embodiments, the pixel circuit layer PCL may further include bottom metal layers BML of the first transistors M1.

At least one first line CL1 (e.g., a plurality of first lines CL1) may be formed in each first line area LA1. In some embodiments, the first lines CL1 may be formed together with the circuit elements of the pixel circuits PXC on the base layer BSL. For example, the first lines CL1 may be located in the same layer as source electrodes SE and drain electrodes DE of the first transistors M1, and may be formed substantially simultaneously with, or in the same process as, the source electrode SE and the drain electrode DE.

At least one second line CL2 (e.g., a plurality of second lines CL2) may be formed in each second line area LA2 of the pixel circuit layer PCL. In some embodiments, the second lines CL2 may be formed together with the circuit elements of the pixel circuits PXC on the base layer BSL. For example, the second lines CL2 may be located in the same layer as the bottom metal layers BML of the first transistors M1, and may be formed substantially simultaneously with, or in the same process as, the bottom metal layers BML.

In addition, signal lines and/or power lines, which are connected to the sub-pixels SPX, may be formed in the pixel circuit layer PCL. For example, scan lines SL, data lines DL, sensing lines SENL, first power lines PL1, and/or second power lines PL2 may be formed in the pixel circuit layer PCL.

Additionally, the pixel circuit layer PCL may include a plurality of insulating layers. For example, the pixel circuit layer PCL may include a first insulating layer INS1, a second insulating layer INS2, a third insulating layer INS3, and/or a fourth insulating layer INS4, which are sequentially located on the one surface of the base layer BSL.

The pixel circuit layer PCL may include a first conductive layer that is located on the base layer BSL and that includes the bottom metal layers BML of the first transistors M1. The first conductive layer may be located between the base layer BSL and the first insulating layer INS1, and may include the bottom metal layers BML overlapping with gate electrodes GE and/or semiconductor patterns SCP of the first transistors M1 included in the sub-pixels SPX. In some embodiments, the bottom metal layers BML may be connected to one electrode (e.g., the source electrode SE) of respective first transistors M1. In addition, the first conductive layer may further include lines (e.g., predetermined lines). For example, the first conductive layer may include at least some lines among lines extending in a second direction DR2 in the display area DA. In an example, the first conductive layer may include the first power lines PL1, the sensing lines SENL, the data lines DL, 2Ath power lines PL2A, and the second lines CL2.

The first insulating layer INS1 may be located on the one surface of the base layer BSL including the first conductive layer. The first insulating layer INS1 may reduce or prevent the likelihood of an impurity being diffused into each circuit element.

A semiconductor layer may be located on the first insulating layer INS1. The semiconductor layer may include semiconductor patterns SCP of transistors. For example, the semiconductor layer may include the semiconductor patterns SCP of the first transistors M1 included in the sub-pixels SPX. Each semiconductor pattern SCP may include a channel region overlapping with a gate electrode GE of a corresponding transistor, and first and second conductive regions (e.g., source and drain regions) located at respective sides of the channel region.

Each semiconductor pattern SCP may be made of polysilicon, amorphous silicon, an oxide semiconductor, or the like. In some embodiments, the semiconductor patterns SCP of the first transistors M1 may include an oxide semiconductor. When the semiconductor patterns SCP of the first transistors M1 are formed of an oxide semiconductor, the mobility of the first transistors M1 can be improved.

The second insulating layer INS2 may be located over the semiconductor layer. In addition, a second conductive layer may be located on the second insulating layer INS2.

The second conductive layer may include gate electrodes GE of the transistors. Also, the second conductive layer may further include one electrode of each of capacitors Cst provided in the pixel circuits PXC and/or bridge patterns.

The third insulating layer INS3 may be located over the second conductive layer. In addition, a third conductive layer may be located on the third insulating layer INS3.

The third conductive layer may include source and drain electrodes SE and DE of the transistors. Also, the third conductive layer may further include one electrode of each of the capacitors Cst provided in the pixel circuits PXC, lines (e.g., predetermined lines), and/or bridge patterns. For example, the third conductive layer may include at least some lines among lines extending in a first direction DR1 in the display area DA. In an example, the third conductive layer may include the scan lines SL, 2Bth power lines PL2B, and the first lines CL1.

Each of the conductive patterns, the electrodes, and/or the lines, which respectively constitute the first to third conductive layers, may include at least one conductive material, thereby having conductivity, and the material constituting each of the conductive patterns, the electrodes, and/or the lines is not particularly limited. In an example, each of the conductive patterns, the electrodes, and/or the lines, which respectively constitute the first to third conductive layers, may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), titanium (Ti), tantalum (Ta), tungsten (W), and copper (Cu). In other embodiments, each of the conductive patterns, the electrodes, and/or the lines, which respectively constitute the first to third conductive layers, may include various kinds of conductive materials.

The fourth insulating layer INS4 may be located over the third conductive layer. In some embodiments, the fourth insulating layer INS4 may include an organic insulating layer, and may planarize a surface of the pixel circuit layer PCL.

The display layer DPL may be located on the fourth insulating layer INS4.

Each of the first insulating layer INS1, the second insulating layer INS2, the third insulating layer INS3, and the fourth insulating layer INS4 may be configured as a single layer or a multi-layer, and may include at least one inorganic insulating material and/or at least one organic insulating material. For example, each of the first insulating layer INS1, the second insulating layer INS2, the third insulating layer INS3, and the fourth insulating layer INS4 may include various kinds of organic/inorganic insulating materials including silicon nitride ($SiN_x$), silicon oxide ($SiO_x$), silicon oxynitride ($SiOxN_y$), etc.

The display layer DPL may include light emitting units EMU of the sub-pixels SPX. For example, the display layer DPL may include first and second electrodes ELT1 and ELT2, at least one light emitting element LD, and first and second contact electrodes CNE1 and CNE2, which are located in an emission area of each sub-pixel SPX. In some embodiments, each light emitting unit EMU may include a plurality of light emitting elements LD as shown in FIG. 3.

Also, the display layer DPL may further include a fifth insulating layer INS5, a sixth insulating layer INS6, a bank BNK, an insulating pattern INP, a light conversion layer CCL, and/or a seventh insulating layer INS7, which are sequentially located above the one surface of the base layer BSL on which the pixel circuit layer PCL is formed.

The fifth insulating layer INS5 may be provided and/or formed on the fourth insulating layer INS4. In some embodiments, the fifth insulating layer INS5 may have an opening or a concave part, which corresponds to the emission area of each sub-pixel SPX. For example, the fifth insulating layer INS5 may have an opening or a concave part, which corresponds to the emission area of each sub-pixel SPX, to surround light emitting elements LD provided in the emission area. In other embodiments, the fifth insulating layer INS5 may be formed with separated patterns individually located respectively on the bottoms of the first electrode ELT1 and the second electrode ELT2.

The first and second electrodes ELT1 and ELT2 may protrude in an upper direction (e.g., a third direction DR3) at the periphery of the light emitting elements LD. The fifth insulating layer INS5, and the first and second electrodes ELT1 and ELT2 on the top thereof, may form a reflective protrusion pattern at the periphery of the light emitting elements LD. Accordingly, the light efficiency of the sub-pixels SPX can be improved.

The fifth insulating layer INS5 may include an inorganic insulating layer made of an inorganic material, or an organic insulating layer made of an organic material. Also, the fifth insulating layer INS5 may be configured as a single layer or a multi-layer.

The first and second electrodes ELT1 and ELT2 of the light emitting unit EMU may be formed on the first insulating layer INS5. For example, a first electrode ELT1 and a second electrode ELT2, which constitute a light emitting unit EMU of each sub-pixel SPX, may be formed on the top of the fifth insulating layer INS5 in the emission area of the corresponding sub-pixel SPX.

Each first electrode ELT1 may be connected to a respective first transistor M1 of a corresponding sub-pixel SPX through a respective first contact hole CH1, and each second electrode ELT2 may be connected to a respective second power line PL2 (e.g., a 2Bth power line PL2B located on a respective pixel row) through a respective second contact hole CH2.

Each of the first and second electrodes ELT1 and ELT2 may include at least one conductive material. In an example, each of the first and second electrodes ELT1 and ELT2 may include at least one metal or any alloy including the same among various metallic materials including silver (Ag), magnesium (Mg), aluminum (Al), platinum (Pt), palladium (Pd), gold (Au), nickel (Ni), neodymium (Nd), iridium (Ir), chromium (Cr), titanium (Ti), molybdenum (Mo), copper (Cu), and the like, at least one conductive oxide such as Indium Tin Oxide (ITO), Indium Zinc Oxide (IZO), Indium Tin Zinc Oxide (ITZO), Zinc Oxide (ZnO), Aluminum doped Zinc Oxide (AZO), Gallium doped Zinc Oxide (GZO), Zinc Tin Oxide (ZTO), Gallium Tin Oxide (GTO), and Fluorine doped Tin Oxide (FTO), and at least one conductive material among conductive polymers such as PEDOT, but the present disclosure is not limited thereto. For example, each of the first and second electrodes ELT1 and ELT2 may include another conductive material including carbon nano tubes, graphene, etc. That is, each of the first and second electrodes ELT1 and ELT2 may include at least one of various conductive materials, thereby having conductivity. Also, the first and second electrodes ELT1 and ELT2 may include the same conductive material or different conductive materials.

Each of the first and second electrodes ELT1 and ELT2 may be configured as a single layer or a multi-layer. In an example, each of the first and second electrodes ELT1 and ELT2 may include a reflective electrode layer including a reflective conductive material (e.g., a metal). Also, each of the first and second electrodes ELT1 and ELT2 may selectively further include at least one of a transparent electrode layer located on the top and/or the bottom of the reflective electrode layer, and a conductive capping layer covering the top of the reflective electrode layer and/or the transparent electrode layer.

The sixth insulating layer INS6 may be located over the first and second electrodes ELT1 and ELT2. In some embodiments, the sixth insulating layer INS6 may be entirely formed on, or formed over an entirety of, the display area DA in which the first and second electrodes ELT1 and ELT2 are formed, and may define openings exposing a respective portion of the first and second electrodes ELT1 and ELT2. In other embodiments, the sixth insulating layer INS6 may include a plurality of contact holes for respectively connecting the first and second electrodes ELT1 and ELT2 to the first and second contact electrode CNE1 and CNE2. The first and second electrodes ELT1 and ELT2 may be respectively connected to the first and second contact electrodes CNE1 and CNE2 in areas in which the sixth insulating layer INS6 is opened (or in areas in which the contact holes are formed in the sixth insulating layer INS6). In still other embodiments, the sixth insulating layer INS6 may be locally located only under an area in which the light emitting elements LD are arranged.

The sixth insulating layer INS6 may be configured as a single layer or a multi-layer, and may include at least one inorganic insulating material and/or at least one organic insulating material. In some embodiments, the sixth insulating layer INS6 may include at least one kind of inorganic insulating material including silicon nitride ($SiN_x$), silicon oxide ($SiO_x$), silicon oxynitride ($SiOxN_y$), etc.

Because the first and second electrodes ELT1 and ELT2 are covered by the sixth insulating layer INS6, damage to the first and second electrodes ELT1 and ELT2 in a subsequent process can be reduced or prevented. Further, the occurrence of a short-circuit defect can be reduced or prevented when the first and second electrodes ELT1 and ELT2 and the light emitting elements LD are inappropriately connected to each other.

In each of the emission areas corresponding to the light emitting units EMU of the sub-pixels SPX, light emitting elements LD may be supplied and aligned on the sixth insulating layer INS6. The light emitting elements LD may be aligned between the first electrode ELT1 and the second electrode ELT2 of a corresponding light emitting unit EMU.

Each light emitting element LD may include a first semiconductor layer SCL1 (e.g., a P-type semiconductor layer), an active layer, and a second semiconductor layer SCL2 (e.g., an N-type semiconductor layer), which are sequentially located in any one direction (e.g., a direction from a first end portion EP1 to a second end portion EP2). Also, each light emitting element LD may further include an insulative film INF surrounding an outer circumferential surface (e.g., a side surface of a cylinder) of the first semiconductor layer SCL1, the active layer ACT, and the second semiconductor layer SCL2. Additionally, each light emitting element LD may selectively further include at least one electrode layer located at the first end portion EP1 and/or the second end portion EP2. In an example, each light emitting element LD may further include an electrode layer ETL provided at the first end portion EP1.

The first semiconductor layer SCL1 may include a first conductivity type semiconductor. For example, the first semiconductor layer SCL1 may include at least one P-type semiconductor layer. In an example, the first semiconductor layer SCL1 may include at least one semiconductor material among InAlGaN, GaN, AlGaN, InGaN, AlN, and InN, and may include a P-type semiconductor layer doped with a first conductivity type dopant (or P-type dopant) such as Mg.

The active layer ACT may be formed in a single-quantum well structure or a multi-quantum well structure. In some embodiments, a material such as AlGaN or AlInGaN may be used to form the active layer ACT. In addition, the active layer ACT may be formed of various materials. The position of the active layer ACT may be variously changed according to the kind of the light emitting element LD. The active layer ACT may emit light having a wavelength of about 400 nm to about 900 nm, and may use a double hetero-structure.

The second semiconductor layer SCL2 may include a semiconductor layer having a type that is different from that of the first semiconductor layer SCL1. For example, the second semiconductor layer SCL2 may include at least one N-type semiconductor layer. In an example, the second semiconductor layer SCL2 may include any one semiconductor material among InAlGaN, GaN, AlGaN, InGaN, AlN, and InN, and may be an N-type semiconductor layer doped with a second conductivity type dopant (or an N-type dopant) such as Si, Ge or Sn.

The electrode layer ETL may be located at a side of the first semiconductor layer SCL1. For example, the electrode layer ETL may be in contact with the first semiconductor layer SCL1, and may be located at the first end portion EP1 of the light emitting element LD. The electrode layer ETL protects the first semiconductor layer SCL1, and may be an electrode for smoothly connecting the first semiconductor layer SCL1 to the first contact electrode CNE1, etc. For example, the electrode layer ETL may be an ohmic contact electrode or a Schottky contact electrode.

The electrode layer ETL may be substantially transparent or translucent. Accordingly, light generated in the light emitting element LD may be emitted to the outside of the light emitting element LD while being transmitted through the electrode layer ETL. In other embodiments, when light generated in the light emitting element LD is not transmitted through the electrode layer ETL, but instead is emitted to the outside of the light emitting element LD, the electrode layer ETL may be formed opaque.

The insulative film INF may be provided on a surface of the light emitting element LD to surround outer circumferential surfaces of the first semiconductor layer SCL1, the active layer ACT, the second semiconductor layer SCL2, and/or the electrode layer ETL. Accordingly, the likelihood of a short-circuit defect through the light emitting element LD can be reduced or prevented, and the electrical stability of the light emitting element LD can be ensured. Further, when the insulative film INF is provided on the surface of the light emitting element LD, the insulative film INF can reduce or minimize a surface defect of the light emitting element LD, thereby improving the lifespan and light emission efficiency of the light emitting element LD, and may reduce or prevent the likelihood of a short-circuit defect occurring between light emitting elements LD in a process of aligning the light emitting elements LD, etc.

The insulative film INF may expose the electrode layer ETL (when the light emitting element LD does not include the electrode layer ETL, may expose the first semiconductor layer SCL1 and/or the second semiconductor layer SCL2) at the first and second end portions EP1 and EP2 of the light emitting element LD. Accordingly, the light emitting element LD may be connected to an electrode (e.g., a predetermined electrode) and/or a line (e.g., a predetermined line).

Meanwhile, before the light emitting elements LD are supplied, the bank BNK may be formed at the periphery of the emission areas of the sub-pixels SPX. For example, the bank BNK may be formed on the sixth insulating layer INS6 to surround the emission areas of the sub-pixels SPX. Accordingly, each emission area to which light emitting elements LD are to be supplied may be defined. In an example, the bank BNK may define a plurality of openings corresponding to the emission areas of the sub-pixels SPX. In some embodiments, the bank BNK may include a light blocking material and/or a reflective material, including a black matrix material, etc. Accordingly, light interference between the sub-pixels SPX can be prevented.

The insulating pattern (insulating patterns) INP may be located on portions of the light emitting elements LD. For example, the insulating pattern INP may be locally located on portions including central portions of light emitting elements aligned in an emission area of a corresponding sub-pixel SPX to expose first and second end portions EP1 and EP2 of the light emitting elements LD. When the insulating pattern INP is formed on the top of the light emitting elements LD, the light emitting elements LD can be stably fixed (e.g., fixed in place), and the first and second contact electrodes CNE1 and CNE2 can be stably separated from each other.

The insulating pattern INP may be configured as a single layer or a multi-layer, and may include at least one inorganic insulating material and/or at least one organic insulating layer. For example, the insulating pattern INP may include various organic/inorganic insulating materials including silicon nitride ($SiN_x$), silicon oxide ($SiO_x$), aluminum oxide ($Al_xO_y$), a photoresist (PR) material, and the like.

The first and second contact electrodes CNE1 and CNE2 may be respectively formed on both end portions (e.g., the first and second end portions EP1 and EP2), which are not covered by the insulating pattern INP.

The first and second contact electrodes CNE1 and CNE2 may be formed to be separated from each other. For example, first and second contact electrodes CNE1 and CNE2 of each sub-pixel SPX may be spaced apart from each other with the insulating pattern INP interposed therebetween. Accordingly, the first contact electrode CNE1 may be connected to first end portions EP1 of light emitting elements LD provided in the corresponding sub-pixel SPX, and the second contact electrode CNE2 may be connected to second end portions EP2 of the light emitting elements LD.

Also, the first contact electrode CNE1 may be located on the top of a first electrode ELT1 of the corresponding sub-pixel SPX to be connected to the first electrode ELT1, and the second contact electrode CNE2 may be located on the top of a second electrode ELT2 of the corresponding sub-pixel SPX to be connected to the second electrode ELT2. Accordingly, the first end portions EP1 of the light emitting elements LD may be connected to the first electrode ELT1, and the second end portions EP2 of the light emitting elements LD may be connected to the second electrode ELT2.

The first and second contact electrodes CNE1 and CNE2 may include at least one conductive material. In some embodiments, the first and second contact electrodes CNE1 and CNE2 may include a transparent conductive material such that light emitted from the light emitting elements LD can be transmitted therethrough.

In some embodiments, the display panel DPN may include the light conversion layer CCL provided over the light emitting elements LD. For example, the light conversion layer CCL may be selectively located on each light emitting unit EMU in which the light emitting elements LD are arranged.

The color conversion layer CCL may include wavelength conversion particles (or color conversion particles) for converting the wavelength and/or the color of light emitted from the light emitting elements LD, and/or light scattering particles SCT for scattering light emitted from the light emitting elements LD, thereby improving the light emission efficiency of the light emitting elements LD. In an example, each light conversion layer CCL including wavelength conversion particles including at least one kind of quantum dot QD (e.g., a red quantum dot, a green quantum dot, and/or a blue quantum dot) and/or light scattering particles SCT may be provided on each light emitting unit EMU. For example, when any one sub-pixel SPX is set as a red (or green) pixel, and blue light emitting elements LD are provided in a light emitting unit EMU of the sub-pixel SPX, a light conversion layer including a red (or green) quantum dot QD for converting blue light into red (or green) light may be located on the light emitting unit EMU of the sub-pixel SPX. Also, the light conversion layer CCL may further include light scattering particles SCT.

The seventh insulating layer INS7 may be formed on, or above, the one surface of the base layer BSL including the light emitting units EMU of the sub-pixels SPX and/or the light conversion layers CCL.

In some embodiments, the seventh insulating layer INS7 may include an organic insulating layer, and may substantially planarize a surface of the display layer DPL. The seventh insulating layer INS7 may protect the light emitting units EMU and/or the light conversion layers CCL.

The color filter layer CFL may be located on the seventh insulating layer INS7.

The color filter layer CFL may include color filters CF corresponding to colors of the sub-pixels SPX. For example, the color filter layer CFL may include a first color filter CF1 located on a first light emitting unit EMU1 of a first sub-pixel SPX1, a second color filter CF2 located on a second light emitting unit EMU2 of a second sub-pixel SPX2, and a third color filter CF3 located on a third light emitting unit EMU3 of a third sub-pixel SPX3. In some embodiments, the first, second, and third color filters CF1, CF2, and CF3 may be located to overlap with each other in a non-emission area in which the bank BNK is formed, thereby blocking light interference between the sub-pixels SPX. In other embodiments, the first, second, and third color filters CF1, CF2, and CF3 may be formed to be separated from each other and respectively located on the first, second, and the third light emitting units EMU1, EMU2, and EMU3 (For example, respectively located on emission areas of the first, second, and the third light emitting units EMU1, EMU2, and EMU3), and a separate light blocking pattern, etc. may be located between the first, second, and the third light emitting units EMU1, EMU2, and EMU3.

The encapsulation layer ENC may be located over the color filter layer CFL. The encapsulation layer ENC may include at least one organic insulating layer and/or at least one inorganic insulating layer, including an eighth insulating layer INS8. The eighth insulating layer INS8 may be entirely formed on the display area DA to cover the pixel circuit layer PCL, the display layer DPL, and/or the color filter layer CFL.

The eighth insulating layer INS8 may be configured as a single layer or a multi-layer, and may include at least one inorganic insulating material and/or at least one organic insulating material. In an example, the eighth insulating layer INS8 may include various kinds of organic/inorganic insulating materials including silicon nitride ($SiN_x$), silicon oxide ($SiO_x$), silicon oxynitride ($SiOxN_y$), etc.

In some embodiments, the eighth insulating layer INS8 may be formed in a multi-layered structure. For example, the eighth insulating layer INS8 may include at least two inorganic insulating layers, and at least one organic insulating layer interposed between the at least two inorganic insulating layers. However, the material constituting the eighth insulating layer INS8 and/or the structure of the eighth insulating layer INS8 may be variously changed. In some embodiments, at least one overcoat layer, at least one filling material layer, and/or an upper substrate may be further located on the eighth insulating layer INS8.

Figure 9:
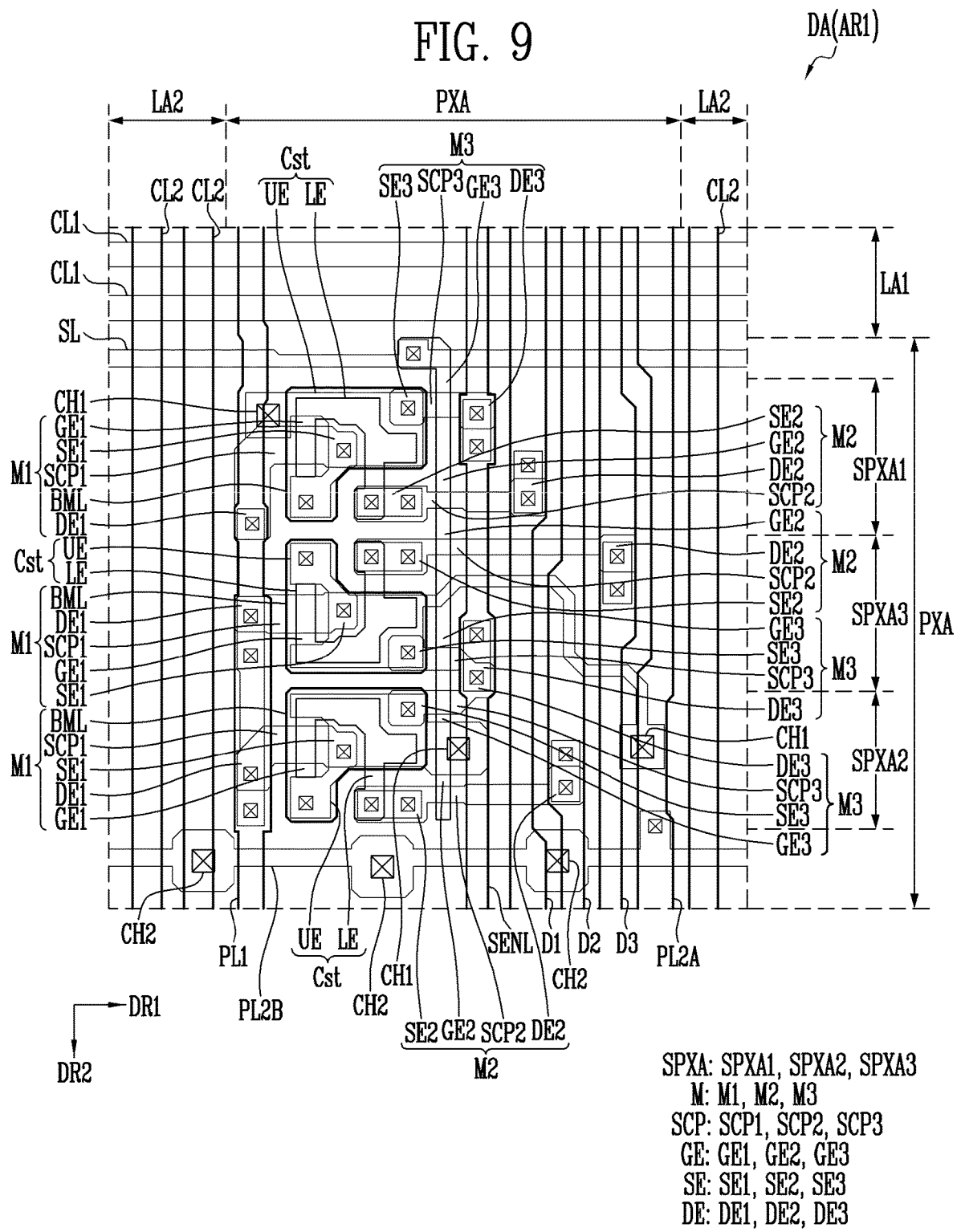
FIG. 9 is a plan view illustrating a display area in accordance with some embodiments of the present disclosure.

FIG. 9 is a plan view illustrating a display area DA in accordance with some embodiments of the present disclosure. For example, FIG. 9 illustrates a layout structure corresponding to area AR1 shown in FIG. 7. For example, FIG. 9 illustrates some embodiments of pixel circuits PXC, signal lines (e.g., a scan line SL, a data line DL, and a sensing line SENL) connected to the pixel circuits PXC, power lines (e.g., first and second power lines PL1 and PL2, and first and second lines CL1 and CL2, which may be located in the pixel circuit layer PCL shown in FIG. 8, among components located in the area AR1 shown in FIG. 7.

Referring to FIGS. 1 to 9, a first pixel circuit PXC1, a second pixel circuit PXC2, and a third pixel circuit PXC3 may be respectively located in a first circuit area SPXA1, a second circuit area SPXA2, and a third circuit area SPXA3. Each pixel circuit PXC may include a first transistor M1, a second transistor M2, a third transistor M3, and a capacitor Cst, which are located in the corresponding circuit area SPXA.

The first transistor M1 may include a first semiconductor pattern SCP1, a first gate electrode GE1, a first source electrode SE1, and a first drain electrode DE1. Also, each first transistor M1 may further include a bottom metal layer BML overlapping with the first gate electrode GE1. The first semiconductor pattern SCP1 may overlap with the first gate electrode GE1, and may be connected to the first source electrode SE1 and the first drain electrode DE1. The first gate electrode GE1 may be connected to a lower electrode LE of the capacitor Cst and to a second source electrode SE2. The first source electrode SE1 may be connected to an upper electrode UE of the capacitor Cst and to a third source electrode SE3. Also, the first source electrode SE1 may be connected to a first electrode ELT1 of a light emitting unit EMU through a first contact hole CH1. The first drain electrode DE1 may be connected to a first power line PL1. The bottom metal layer BML may be connected to the first source electrode SE1.

The second transistor M2 may include a second semiconductor pattern SCP2, a second gate electrode GE2, the second source electrode SE2, and a second drain electrode DE2. The second semiconductor pattern SCP2 may overlap with the second gate electrode GE2, and may be connected to the second source electrode SE2 and the second drain electrode DE2. The second gate electrode GE2 may be connected to a scan line SL. The second source electrode SE2 may be connected to the lower electrode LE of the capacitor Cst and the first gate electrode GE1. The second drain electrode DE2 may be connected to any one sub-data line. For example, a second drain electrode DE2 of the first pixel circuit PXC1, a second drain electrode DE2 of the second pixel circuit PXC2, and a second drain electrode DE2 of the third pixel circuit PXC3 may be respectively connected to a first sub-data line D1, a second sub-data line D2, and a third sub-data line D3.

The third transistor M3 may include a third semiconductor pattern SCP3, a third gate electrode GE3, the third source electrode SE3, and a third drain electrode DE3. The third semiconductor pattern SCP3 may overlap with the third gate electrode GE3, and may be connected to the third source electrode SE3 and the third drain electrode DE3. The third gate electrode GE3 may be connected to the scan line SL. In other embodiments, the third gate electrode GE3 may be connected to a separate control line SSL separated from the scan line SL. The third source electrode SE3 may be connected to the upper electrode UE of the capacitor Cst and the first source electrode SE1. The third drain electrode DE3 may be connected to a sensing line SENL.

The capacitor Cst may include the lower electrode LE and the upper electrode UE. The lower electrode LE may be connected to the first gate electrode GE1 and the second source electrode SE2. The upper electrode UE may be connected to the first source electrode SE1 and the third source electrode SE3.

In some embodiments, bottom metal layers BML, sensing lines SENL, data lines DL (or first, second, and third sub-data lines D1, D2, and D3), 2Ath power lines PL2A, and second lines CL2, which are provided in the display area DA, may be located in the same layer of a pixel circuit layer PCL. For example, the bottom metal layers BML, the sensing lines SENL, the data lines DL (or the first, second, and third sub-data lines D1, D2, and D3), the 2Ath power lines PL2A, and the second lines CL2 may be located in a first conductive layer (e.g., a lower conductive layer) of the pixel circuit layer PCL.

In some embodiments, semiconductor patterns SCP provided in the display area DA may be located in the same layer of the pixel circuit layer PCL. For example, the semiconductor patterns SCP may be located in a semiconductor layer of the pixel circuit layer PCL.

In some embodiments, gate electrodes GE and lower electrodes LE of capacitors Cst, which are provided in the display area DA, may be located in the same layer of the pixel circuit layer PCL. For example, the gate electrodes GE and the lower electrodes LE of the capacitors Cst may be located in a second conductive layer (e.g., a gate layer) of the pixel circuit layer PCL.

In some embodiments, source electrodes SE, drain electrodes DE, upper electrodes UE of the capacitors Cst, scan lines SL, 2Bth power lines PL2B, and first lines CL1, which are provided in the display area DA, may be located in the same layer of the pixel circuit layer PCL. For example, the source electrodes SE, the drain electrodes DE, the upper electrodes UE of the capacitors Cst, the scan lines SL, the 2Bth power lines PL2B, and the first lines CL1 may be located in a third conductive layer (e.g., a source-drain layer) of the pixel circuit layer PCL.

As shown in FIG. 9, circuit elements and lines of the pixel circuit layer PCL are efficiently located, so that the area of each pixel circuit area PXCA can be reduced. Accordingly, spaces for locating first line areas LA1 and second line areas LA2 can be secured between the pixel circuit areas PXCA of the pixel circuit layer PCL (e.g., between pixel circuit areas PXCA of adjacent pixel rows and between pixel circuit areas PXCA of adjacent pixel columns).

Figure 10:
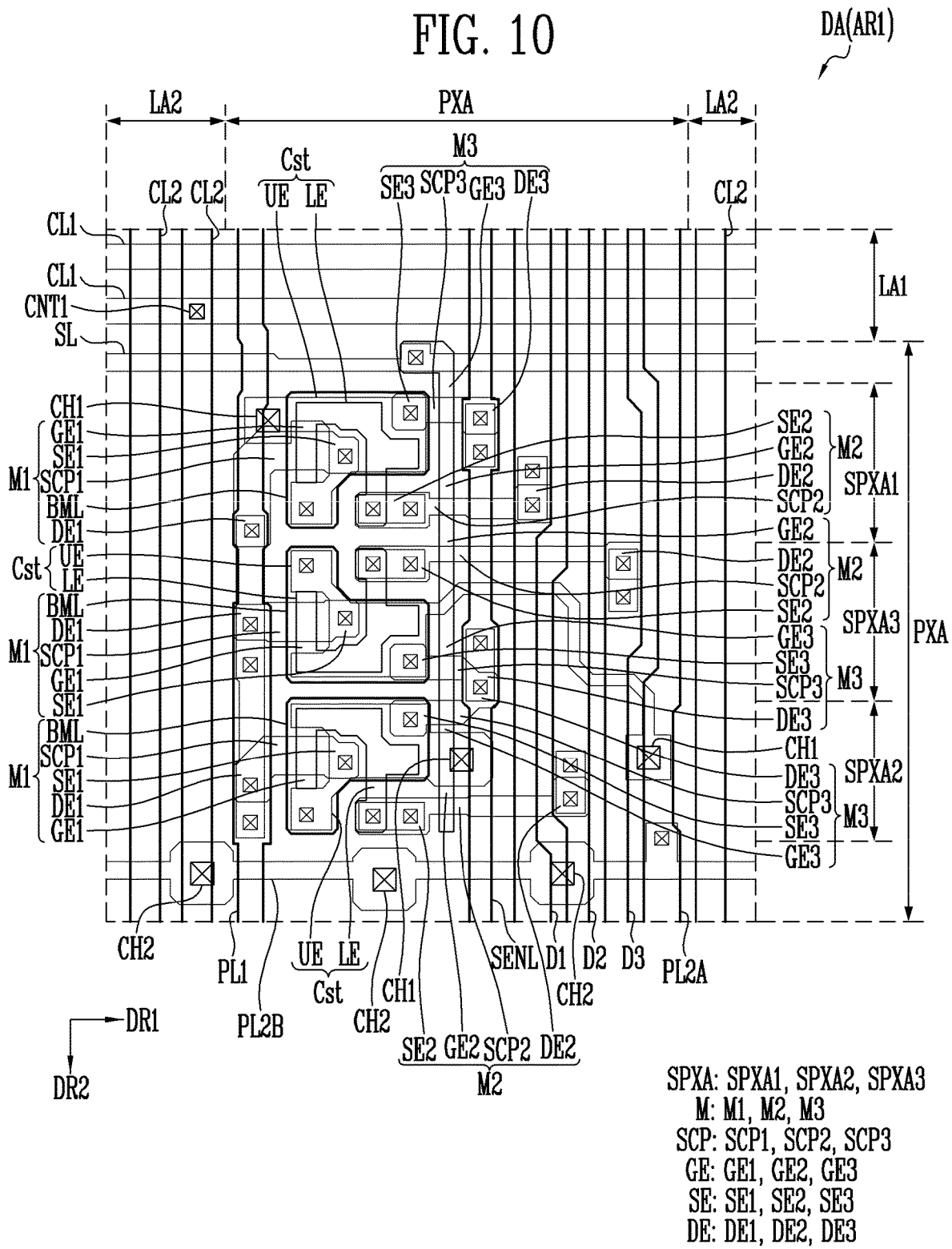
FIG. 10 is a plan view illustrating a display area in accordance with some embodiments of the present disclosure.

FIG. 10 is a plan view illustrating a display area DA in accordance with some embodiments of the present disclosure. For example, FIG. 10 illustrates one area of a display area DA corresponding to the area AR1 shown in FIG. 9. For example, FIG. 10 illustrates a first contact part CNT1 through which a pair of first and second lines CL1 and CL2 are connected to each other, and a peripheral area thereof.

Referring to FIGS. 1 to 10, a pair of first and second lines CL1 and CL2 connecting any one first pad PAD1 and any one scan line SL corresponding thereto (or any one first pad PAD1' and any one data line DL or sub-data line corresponding thereto) may be connected to each other through a first contact part CNT1 in an area in which the pair of first and second lines CL1 and CL2 cross each other. The first contact part CNT1 may include at least one contact hole. In this manner, first lines CL1 may be respectively connected to second lines CL2 through first contact parts CNT1 in areas in which first line areas LA1 and second line areas LA2 cross each other.

Figure 11:
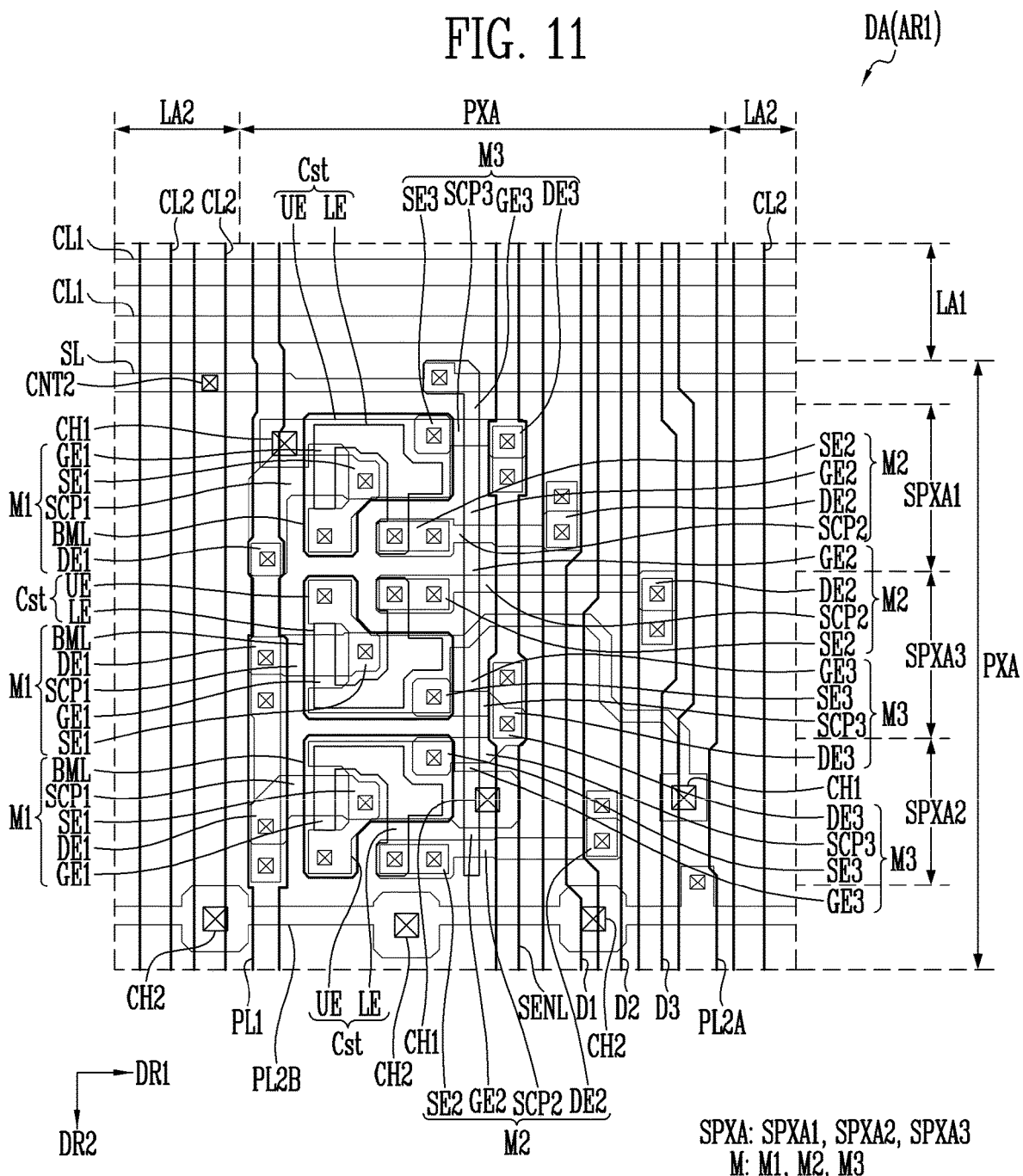
FIG. 11 is a plan view illustrating a display area in accordance with some embodiments of the present disclosure.

FIG. 11 is a plan view illustrating a display area DA in accordance with some embodiments of the present disclosure. For example, FIG. 11 illustrates one area of a display area DA corresponding to the area AR1 shown in FIG. 9. For example, FIG. 11 illustrates a second contact part CNT2 through which a pair of a second line CL2 and a scan line SL are connected to each other, and a peripheral area thereof.

Referring to FIGS. 1 to 11, a second line CL2 for connecting any one first pad PAD1 and any one scan line SL corresponding thereto may be connected to the scan line SL through a second contact part CNT2 in an area in which the second line CL2 crosses the scan line SL. The second contact part CNT2 may include at least one contact hole. In this manner, second lines CL2 may be respectively connected to scan lines SL through second contact parts CNT2.

Figure 12:
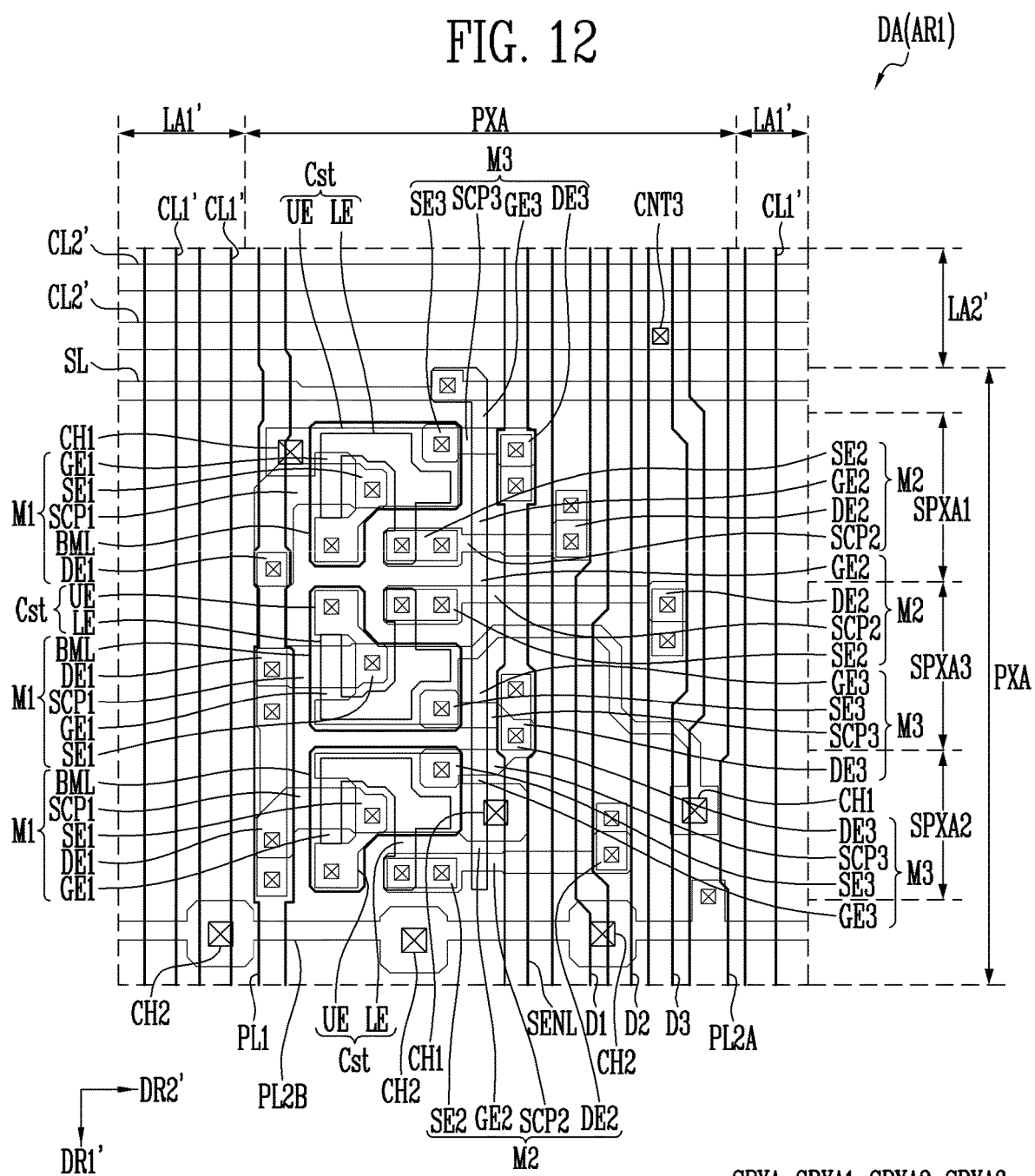
FIG. 12 is a plan view illustrating a display area in accordance with some embodiments of the present disclosure.

FIG. 12 is a plan view illustrating a display area DA in accordance with some embodiments of the present disclosure. For example, FIG. 12 illustrates an area of a display area DA corresponding to the area AR1 shown in FIG. 9. In some embodiments in which first pads PAD1' are respectively connected to data lines DL through first and second lines CL1' and CL2', as shown in FIG. 5, FIG. 12 illustrates a third contact part CNT3 through which any one second line CL2' and a data line DL corresponding thereto are connected to each other, and a peripheral area thereof.

Referring to FIGS. 1 to 12, first lines CL1' may be located in a first line area LA1 extending in a first direction DR1', and may extend in the first direction DR1'. In some embodiments, the first lines CL1' may be located in the same layer as bottom metal layers BML, sensing lines SENL, data lines DL (or first, second, and third sub-data lines D1, D2, and D3), and 2Ath power lines PL2A.

Second lines CL2' may be located in a second line area LA2' extending in a second direction DR2', and may extend in the second direction DR2'. In some embodiments, the second lines CL2' may be located in the same layer as source electrodes SE, drain electrodes DE, upper electrodes UE of capacitors Cst, scan lines SL, and 2Bth power lines PL2B.

A second line CL2' for connecting any one first pad PAD1' and any one data line DL (e.g., a third sub-data line D3) corresponding thereto may be connected to the third sub-data line D3 through a third contact part CNT3 in an area in which the second line CL2' crosses the third sub-data line D3. The third contact part CNT3 may include at least one contact hole. In this manner, the second lines CL2' may be respectively connected to the data lines DL through third contact parts CNT3. Also, the second lines CL2' may be respectively connected to the first lines CL1' in areas in which the second lines CL2' cross the first lines CL1'.

As described above, the display device DD in accordance with the embodiments of the present disclosure may include first signal lines SLI1 or SLI1' extending along a first direction DR1 to DR1' in the display area DA, first lines CL1 or CL1' that extend to the display area DA from a first pad area PA1 or PA1' located at a side of the display area DA and that are connected to the respective first pads PAD1 or PAD1', and the second lines CL2 or CL2' connecting the first lines CL1 or CL1' and the first signal lines SLI1 or SLI' in the display area DA. The first lines CL1 or CL1' may extend along the first direction DR1 or DR1' to the display area DA from the first pad area PA1 or PA1', and may be arranged in only a first sub-display area SDA1 or SDA1' of a zone that is adjacent to the first pad area PA1 or PA1' in the display area DA.

In accordance with the embodiments of the present disclosure, the first lines CL1 or CL1' may immediately or directly extend to the display area DA from the first pad area PA1 or PA1' without locating any fan-out area between the first pad area PA1 or PA1' and the display area DA. Accordingly, the non-display area NA of the display device DD may be reduced.

In accordance with the present disclosure, the display device DD includes first signal lines SLI1, SLI1' extending along a first direction DR1 in the display area DA, first lines CL1, CL1' that extend along the first direction DR1 to the display area DA from a first pad area PA1, PA1' and that are connected to first pads PAD1, PAD1', and second lines CL2, CL2' connecting the first lines CL1, CL1' and the first signal lines SLI1, SLI1' in the display area DA. In the display area DA, the first lines CL1, CL1' are arranged in only a sub-display area of a zone corresponding to the first pad area PA1, PA1'.

In accordance with the present disclosure, the first lines CL1, CL1' may immediately or directly extend to the display area DA from the first pad area PA1, PA1', without locating any fan-out area between the first pad area PA1, PA1' and the display area DA, the fan-out area being an area in which a distance (or pitch) between at least some first lines CL1, CL1' is changed or varied. Accordingly, the non-display area NA of the display device DD may be reduced.

Embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with any of the embodiments may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims, with functional equivalents thereof the be included therein.

What is claimed is:

1. A display device comprising:
    first signal lines arranged in a display area, and extending in a first direction;
    pixels arranged in the display area, and respectively connected to the first signal lines;
    first pads located in a first pad area at a side of the display area in the first direction, and arranged along a second direction crossing the first direction;
    second pads in a second pad area at a side of the display area in the second direction;
    first lines extending along the first direction to the display area from the first pad area, and respectively connected to the first pads; and
    second lines arranged in the display area, and respectively connecting the first lines to the first signal lines, such that the pixels are respectively configured to receive signals directly from the first pads and the second pads,
    wherein the display area comprises a first sub-display area corresponding to the first pad area, and a second sub-display area adjacent the first sub-display area, and
    wherein the first lines are arranged only in the first sub-display area among the first and second sub-display areas.

2. The display device of claim 1, wherein the first lines are arranged along the second direction at a same pitch as the first pads at a boundary of the display area and the first pad area.

3. The display device of claim 1, wherein the display area comprises first line areas respectively between adjacent pixel rows, and extending in the first direction.

4. The display device of claim 3, wherein the first lines are in the first line areas.

5. The display device of claim 4, wherein the display area comprises second line areas respectively between adjacent pixel columns, and extending in the second direction, and
    wherein the second lines are in the second line areas.

6. The display device of claim 5, wherein the first lines are respectively connected to the second lines through respective first contact parts in areas in which the first line areas and the second line areas cross each other.

7. The display device of claim 5, wherein the first line areas are respectively between pixel circuit areas of the adjacent pixel rows, and
    wherein the second line areas are respectively between pixel circuit areas of the adjacent pixel columns.

8. The display device of claim 1, wherein the second lines extend along the second direction, and are arranged in the first sub-display area and the second sub-display area.

9. The display device of claim 1, wherein the pixels comprise sub-pixels, which comprise:
    pixel circuits in respective pixel areas, and respectively connected to the first signal lines; and
    light emitting units respectively in the pixel areas to respectively overlap the pixel circuits, and comprising at least one light emitting element connected to a respective one of the pixel circuits.

10. The display device of claim 9, wherein the pixel circuits of the sub-pixels are arranged along the second direction in the pixel areas, and
    wherein the light emitting units of the sub-pixels are arranged along the first direction in the pixel areas.

11. The display device of claim 9, wherein the first lines and the second lines are in different layers of a pixel circuit layer in which the pixel circuits of the sub-pixels are formed, and
    wherein the first signal lines are in a same layer as the first lines.

12. The display device of claim 1, further comprising second signal lines arranged in the display area to cross the first signal lines, and respectively connected to the pixels.

13. The display device of claim 12, wherein the first lines are spaced apart from, and in a same layer as, the first signal lines, and
    wherein the second lines are spaced apart from, and in a same layer as, the second signal lines.

14. The display device of claim 12, wherein the first signal lines comprise scan lines for receiving scan signals, and
wherein the second signal lines comprise data lines for receiving data signals.

15. The display device of claim 14, wherein the first direction is a horizontal direction of the display area, and
wherein the second direction is a vertical direction of the display area.

16. The display device of claim 12, wherein the first signal lines comprise data lines for receiving data signals, and
wherein the second signal lines comprise scan lines for receiving scan signals.

17. The display device of claim 16, wherein the first direction is a vertical direction of the display area, and
wherein the second direction is a horizontal direction of the display area.

18. A display device comprising:
first signal lines arranged in a display area, and extending in a first direction;
pixels arranged in the display area, and respectively connected to the first signal lines;
second signal lines arranged in the display area to cross the first signal lines, and respectively connected to the pixels;
first pads located in a first pad area at a side of the display area in the first direction, and arranged along a second direction;
second pads in a second pad area at a side of the display area in the second direction;
first lines extending along the first direction to the display area from the first pad area, and respectively connected to the first pads; and
second lines arranged in the display area, and respectively connecting the first lines to the first signal lines, such that the pixels are respectively configured to receive signals directly from the first pads;
third lines extending along the second direction to the display area from the second pad area, and respectively connected to the second pads; and
fourth lines crossing the third lines and the second signal lines, and respectively connecting the third lines to the second signal lines,
wherein the display area comprises a first sub-display area corresponding to the first pad area, and a second sub-display area adjacent the first sub-display area, and
wherein the first lines are arranged only in the first sub-display area among the first and second sub-display areas.

19. The display device of claim 18, wherein the display area comprises a third sub-display area corresponding to the second pad area, and a fourth sub-display area adjacent the third sub-display area in the first direction, and
wherein the third lines are arranged only in the third sub-display area among the third and fourth sub-display areas.

20. The display device of claim 18, wherein the third lines are arranged along the first direction at a same pitch as the second pads at a boundary between the display area and the second pad area.

* * * * *